US006690608B2

(12) United States Patent
Nii et al.

(10) Patent No.: US 6,690,608 B2
(45) Date of Patent: Feb. 10, 2004

(54) SEMICONDUCTOR MEMORY DEVICE WITH INTERNAL DATA READING TIMING SET PRECISELY

(75) Inventors: Koji Nii, Hyogo (JP); Yasunobu Nakase, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/329,355

(22) Filed: Dec. 27, 2002

(65) Prior Publication Data

US 2003/0202412 A1 Oct. 30, 2003

(30) Foreign Application Priority Data

Apr. 30, 2002 (JP) ........................................ 2002-128538

(51) Int. Cl.⁷ .............................................. G11C 7/02
(52) U.S. Cl. .................................... 365/210; 365/185.2
(58) Field of Search .............................. 365/210, 185.2

(56) References Cited

U.S. PATENT DOCUMENTS 5,566,386 A * 10/1996 Kumakura et al. .......... 365/226
5,592,427 A * 1/1997 Kumakura et al. .......... 365/205
6,285,604 B1 * 9/2001 Chang ........................ 365/200

FOREIGN PATENT DOCUMENTS

| JP | 03-122898 | 5/1991 |
|----|-----------|--------|
| JP | 09-270468 | 10/1997 |
| JP | 10-178110 | 6/1998 |
| JP | 11-339476 | 12/1999 |
| JP | P2001-28401 A | 1/2001 |

OTHER PUBLICATIONS

"Universal–Vdd 0.65–2.0V 32kB Cache using Voltage–Adapted Timing–Generation Scheme and a Lithographical–Symmetric Cell", K. Osada et al., IEEE, ISSCC 2001, Digest of Technical Papers, Feb. 6, 2001, pp. 168–169.

* cited by examiner

Primary Examiner—Michael S. Lebentritt
Assistant Examiner—Tuan T. Nguyen
(74) Attorney, Agent, or Firm—McDermott, Will & Emery

(57) ABSTRACT

Dummy cells each having the same layout as a normal memory cell are aligned in a row direction to the normal memory cells, and are arranged in rows and columns. In each dummy cell column, a dummy bit line is arranged, and a plurality of dummy cells are simultaneously selected and connected to the corresponding dummy bit line when one word line is selected. A voltage detecting circuit detects the potentials on the dummy bit lines to determine timing of activation of a sense amplifier. In the semiconductor memory device, the potential on the dummy bit line can be changed at high speed, and internal data read timing can be optimized independent of a structure of a memory cell array.

20 Claims, 27 Drawing Sheets

SEMICONDUCTOR MEMORY DEVICE WITH INTERNAL DATA READING TIMING SET PRECISELY

BACKGROUND OF THE INVENTION

1. Field of the Invention

The present invention relates to a semiconductor memory device, and particularly to a semiconductor memory device, which can internally produce data read timing with accuracy.

2. Description of the Background Art

In a static RAM (Random Access Memory), a word line drive pulse having a predetermined active period is produced in accordance with a change in address signal, and is applied to a word line. This word line drive pulse is produced with a sufficient margin in advance, so that correct data can be reliably read out even if a time required for data reading changes due to variations in process, change in ambient temperature and other(s). However, if the word line drive pulse has an extra margin, a read cycle time unnecessarily increases.

Japanese Patent Laying-Open No. 11-339476, for example, discloses a method, in which a read signal read from a dummy memory cell is supplied to a word line drive circuit or a row decoder for reducing a margin of the word line drive pulse to reduce a read cycle time.

In this conventional art, a read current is produced on a dummy bit line in accordance with data stored in the dummy cell. A potential change of the dummy bit line is detected to detect timing for reading out data from a normal memory cell, and equalizing of the bit line and deactivation of the selected word line are executed to aim minimization of the margin of the word line drive pulse.

In addition, a discharging time of the bit line is minimized for reducing current consumption.

In the prior art reference described above, a dummy bit line is connected to dummy cells, which are equal in number to normal memory cells connected to a normal bit line, so that the dummy bit line can have the same load as the normal bit line. However, when a dummy cell is selected, one dummy cell is driven to the selected state by a dummy cell driver, which is provided separately from a normal word line driver.

For increasing the integration degree of the memory cells, transistor sizes thereof are minimized. Therefore, when the bit line is discharged by the memory cell, only small potential change occurs on the normal bit line, so that the potential on the normal bit line changes only minutely. A differential type sense amplifier circuit having a high sensitivity is used for detecting such minute potential difference between normal bit lines in pair to determine data read from the memory cell, intending to speed up the data reading.

In the foregoing prior art, however, the dummy bit line is driven by one dummy cell so that change in potential on the dummy bit line, which transmits a signal read from the dummy cell, is substantially the same as change in potential on the normal bit line. Accordingly, the change in potential on the dummy bit line is a minute one. For detecting the potential change of the dummy bit line by a level detecting circuit such as an inverter, a long period is required before the potential on the dummy bit line lowers to or below the input threshold voltage of the inverter. Therefore, it becomes disadvantageously difficult to optimize the activation timing of the sense amplifier, activation timing of the bit line precharging and deactivation timing of a selected word line.

When one dummy cell is used to drive the dummy bit line, it is necessary to ensure a margin considering variation in sinking current of the selected dummy cell and variation in sinking current of the normal memory cell.

In general, as scaling is advanced to increase miniaturization of the elements, the degrees of variation in final geometrical feature and variation in dose of implanted impurity are increased so that variation in transistor characteristics becomes more significant. The degree of the variation in transistor characteristics further increases as a power supply voltage is lowered.

Accordingly, if one dummy cell is fixedly selected as disclosed in the foregoing prior art, accurate timing cannot be detected due to variations in transistor characteristics of the selected normal memory cell and the dummy cell. For example, if the transistor characteristics of the dummy cell may varies to a better characteristics to change the dummy bit line at higher speed, while transistor characteristics of a selected normal memory cell varies to a worse direction to slow down the change of the normal bit line, the deactivation of the word line and the activation of the sense amplifier are performed at excessively early timing so that a malfunction may occur.

For preventing the malfunction due to such variations in transistor characteristics of the dummy cell and normal memory cell, it is necessary to ensure a margin such that stable operations can be performed even under worst conditions. For these reasons, it is impossible to achieve the object of reducing the margin in the word line drive timing, and accordingly it becomes impossible to increase an operation speed and to reduce power consumption.

In ISSCC 2001, "Digest of Technical Papers", pp. 168 and 169, Osada et al. discloses a structure, in which a plurality of dummy cells are simultaneously driven to the selected state to discharge the dummy bit line so that variation in discharging current of the dummy bit line can be leveled, to advance the timing of the read activation of the sense amplifier. In this structure, however, a dummy word line for selecting the dummy cells is provided separately from a normal word line for selecting the normal memory cell. The dummy cells connected to the dummy word line are fewer than the normal memory cells connected to the normal word line, and therefore, the dummy word line is driven to the selected state faster than the normal word line.

Thus, the dummy bit line is discharged at a timing faster than the timing of selecting the normal memory cell to discharge the normal bit line. Accordingly, the circuit design has to be made in consideration of difference in timing between driving of the dummy word line to the selected state and driving of the normal word line to the selected state, although a high margin is ensured for the variations in transistor characteristics of the memory cells by averaging the sinking current of the dummy bit line by the use of the plurality of dummy cells.

In particular, for another memory cell array having a different structure, in which a different number of normal memory cells are connected to one word line, or the number of normal memory cells connected to the normal bit line is changed, it is necessary to consider the difference in discharging speed between the normal bit line and the dummy bit line. Therefore, re-design is required for each structure of the memory cell array, taking into consideration the difference in activation timing between the dummy word line and the normal word line. In particular, for various bit/word configurations required in system LSIs and others, the optimum timing values must be set for each configuration, leading to a problem that an extremely long period is required for the design and development.

SUMMARY OF THE INVENTION

An object of the present invention is to provide a semiconductor memory device, of which internal operation timing can be easily determined with accuracy.

Another object of the present invention is to provide a semiconductor memory device, in which an internal data read activation signal can be produced at an accurate timing regardless of variation in transistor characteristics.

A further object of the present invention is to provide a semiconductor memory device, in which an optimized internal data read activation signal can be easily produced even with a memory cell array configuration changed.

A semiconductor memory device according to the present invention includes a plurality of normal memory cells arranged in rows and columns, a plurality of dummy cells arranged in a plurality of columns, a plurality of dummy bit lines, arranged corresponding to the dummy cell columns, each connected to the dummy cells in the corresponding column, and a plurality of word lines, arranged corresponding to the normal memory cell rows, each connected to the normal memory cells in the corresponding row. A plurality of dummy cells in each of the plurality of dummy cell columns are connected to each word line.

The plurality of dummy cells aligned in the column direction are connected to the word line, and the dummy cells selected simultaneously are connected to the common dummy bit line. The potential on the dummy bit line can be changed rapidly, and the variation in transistor characteristics of the dummy cells can be leveled. It is possible to increase a margin for variation in transistor characteristics, and it is possible to activate a sense amplifier activating signal at accurate timing.

Since a signal of the dummy bit line changes more rapidly than the signal on the normal bit line, a large timing margin can be provided for sense amplifier activation, and the timing of sense amplifier activation can be optimized.

Since it is possible to optimize the activation timing of the sense amplifier, a period of selection of the word line can be short, and a current required for charging and discharging the bit line can be reduced so that current consumption can be reduced.

With a layout of the dummy cells made the same as a layout of the normal memory cell, the dummy bit line and the normal bit line can have the same load capacitance, and the changing speed of the potential on the dummy bit line can be accurately greater than that of the potential on the normal bit line.

Since the dummy cell and the normal memory cell are driven to the selected state by a common word line, it is not necessary to arrange separate word line drivers for the dummy cell and for the normal memory cell, respectively. Even when the array structure is changed, the dummy bit line and the normal bit line can be accurately driven at the same timing, and the potential on the dummy bit line can change more rapidly.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
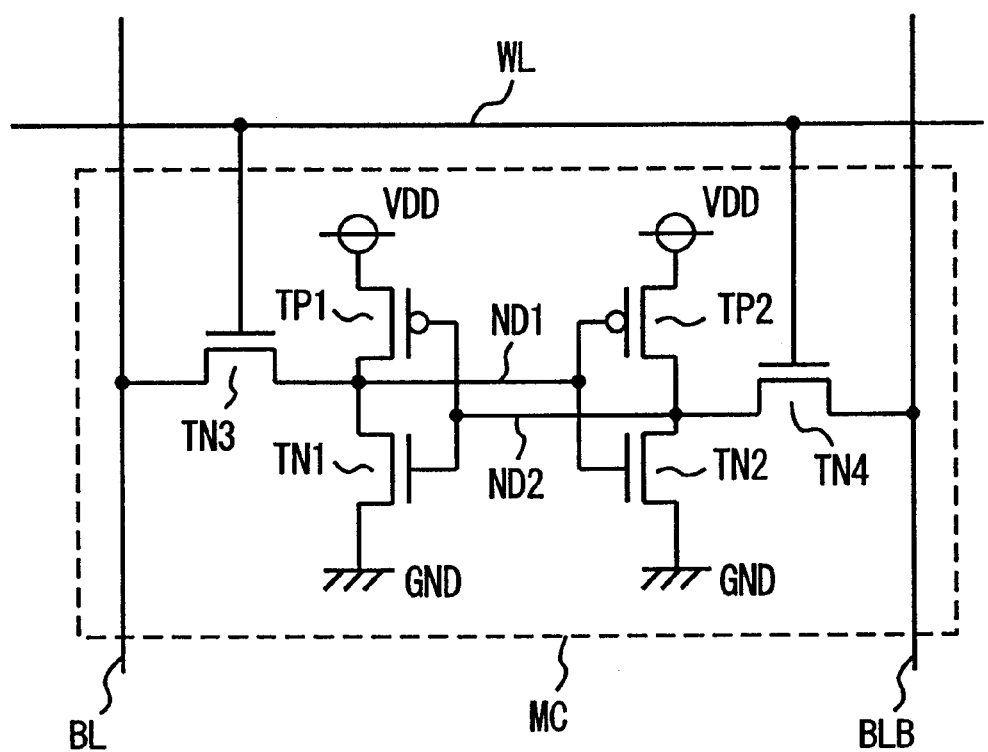
FIG. 1 shows an electrically equivalent circuit of a normal memory cell according to a first embodiment of the invention.

FIG. 1 shows an electrically equivalent circuit of the normal memory cell employed in the present invention. In FIG. 1, a normal memory cell MC includes a P-channel MOS transistor (insulated gate field effect transistor) TP1 connected between a power supply node and a node ND1 and having a gate connected to a node ND2, an N-channel MOS transistor TN1 connected between node ND1 and a ground node and having a gate connected to node ND2, a P-channel MOS transistor TP2 is connected between the power supply node and node ND2 and having a gate connected to node ND 1, and an N-channel MOS transistor TN2 connected between node ND2 and the ground node and having a gate connected node ND1.

MOS transistors TP1 and TN1 form a CMOS (Complementary MOS) inverter, and MOS transistors TP2 and TN2 form a CMOS inverter. These two CMOS inverters form a latch circuit.

Normal memory cell MC further includes an N-channel MOS transistor TN3 for connecting node ND1 to normal bit line BL in response to a signal on a word line WL, and an N-channel MOS transistor TN4 for connecting a node ND2 to a complementary normal bit line BLB in response to the signal on word line WL.

Normal memory cells MC, of which entire arrangement will be described later, are arranged in rows and columns. The normal memory cells aligned in the row direction are connected to word line WL, and normal memory cells MC aligned in the column direction are connected to normal bit lines BL and BLB.

Nodes ND1 and ND2 store data complementary to each other. Therefore, normal bit lines BL and BLB transmit data complementary to each other.

Figure 2:
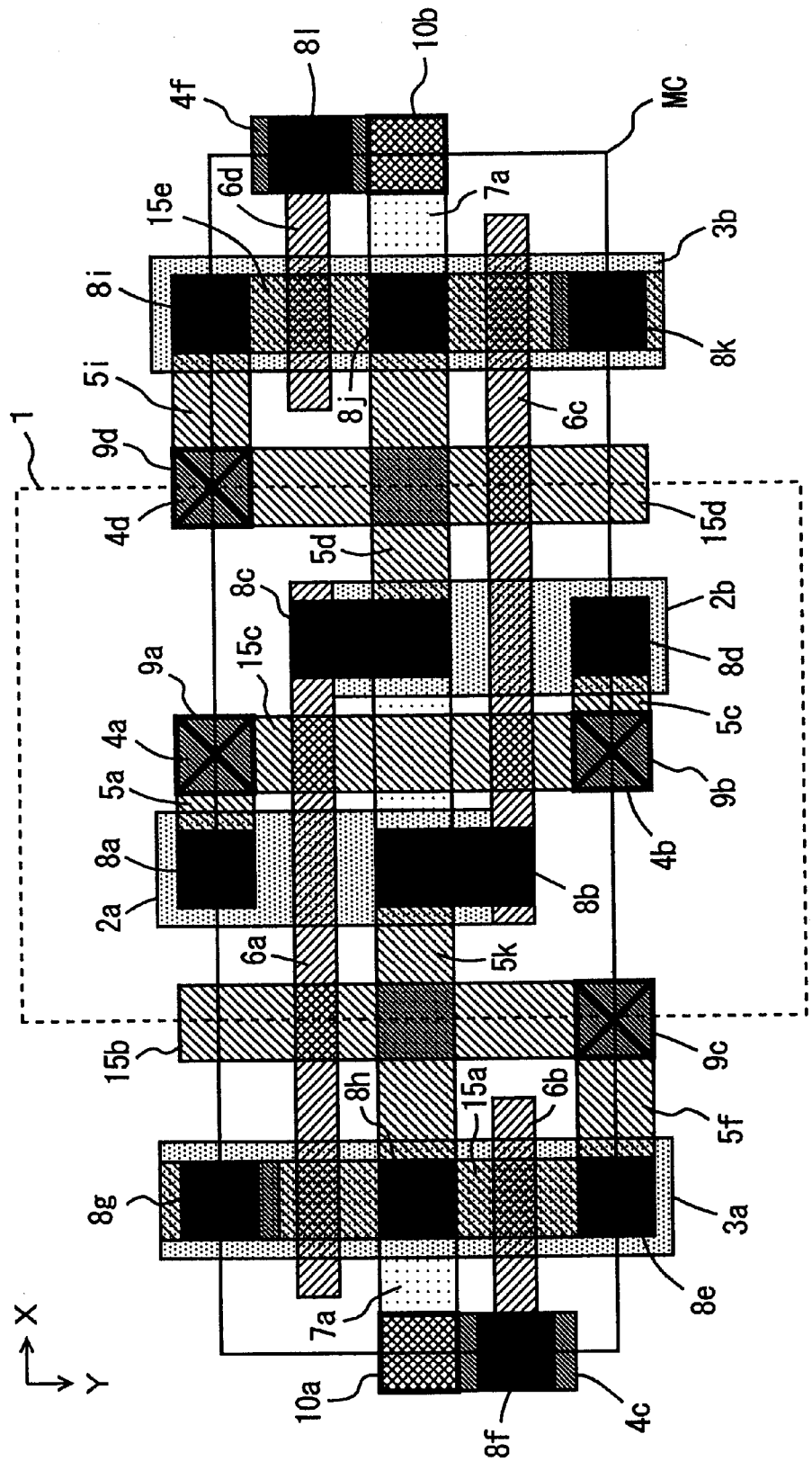
FIG. 2 shows a layout of the normal memory cell shown in FIG. 1.

FIG. 2 schematically shows a layout of the normal memory cell shown in FIG. 1. In FIG. 2, P-channel MOS transistors TP1 and TP2 are formed in an N-well region 1. In N-well region 1, active regions 2a and 2b are formed extending in an X direction with a space in between. Each of active regions 2a and 2b includes an impurity region and a channel region.

Active region 2a is connected to a first metal interconnection line (simply referred to as interconnection hereinafter) 5a through a contact hole 8a. First metal interconnection 5a is connected to a second metal interconnection 15c extending in a Y direction through a first via hole 9a. Connection between first and second metal interconnections 5a and 15c is made through a polycrystalline silicon interconnection 4a formed at first via hole 9a.

Second metal interconnection 15c has an end connected to polycrystalline silicon interconnection 4b through a first via hole 9b. Polycrystalline silicon interconnection 4b is connected to a first metal interconnection 5c extending in the X direction. First metal interconnection 5c is connected to active region 2b through contact hole 8a. Second metal interconnection 15c constitutes a power supply line transmitting a power supply voltage VDD.

Active region 2a has a lower end portion connected to a first polycrystalline silicon interconnection 6c extending in the X direction through a contact hole 8b, and active region 2b has an upper end portion connected to first polycrystalline silicon interconnection 6a extending in the X direction through a contact hole 8c.

First metal interconnections 5k and 5d, extending in the X direction from the respective active regions 2a and 2b, are arranged between polycrystalline silicon interconnections 6a and 6c. These first metal interconnections 5k and 5d constitute internal nodes of the memory cell.

Third metal interconnection 7a is arranged extending in the X direction and parallel to first metal interconnections 5d and 5k. Active region 2a is electrically connected to first metal interconnection 5d through contact hole 8b, and active region 2b is connected to a first metal interconnection 5b through contact hole 8c. A channel region is formed in a crossing portion between first polycrystalline silicon interconnection 6a and active region 2a, and a channel region is formed in a crossing portion between first polycrystalline silicon interconnection 6c and active region 2b.

According to the arrangement described above, load P-channel MOS transistors receiving the power supply voltage on their sources are formed in N-well region 1. In other words, P-channel MOS transistors TP1 and TP2 having gates and drains cross-coupled are formed.

Second metal interconnections 15b and 15d are arranged at the ends extending in the Y direction of N-well 1, respectively. Second metal interconnection 15b is connected to a first metal interconnection 5f extending in the X direction through a first via hole 9c. First metal interconnection 5f is connected to an active region 3a through a contact hole 8e. Active region 3a is formed into a rectangular form extending in the Y direction, and N-channel MOS transistors are formed in active region 3a. Active region 3a is connected to first metal interconnection 5k through a contact hole 8h.

A second metal interconnection 15a is arranged parallel to active region 3a. Second metal interconnection 15a is connected to active region 3a through a contact hole 8g. Second metal interconnection 15a constitutes a ground line transmitting a ground voltage.

Third metal interconnection 7a is connected to a second polycrystalline silicon interconnection 4c extending in the Y direction through second via hole 10a and a second metal interconnection. Second polycrystalline silicon interconnection 4c is connected to a first polycrystalline silicon interconnection 6b extending in the X direction through a contact hole 8f. First polycrystalline silicon interconnection 6b is placed, between first metal interconnections 5k and 5f, extending in the X direction to constitute a gate of an access transistor. Third metal interconnection 7a constitutes a word line, and transmits a word line select signal. Second metal interconnection 15b constitutes a bit line.

First polycrystalline silicon interconnection 6a extends in the X direction so as to cross active region 3a. An N-channel MOS transistor (driver transistor) storing data is formed in active region 3a and between contact holes 8g and 8h, with a portion crossing second metal interconnection 6a being a channel portion.

Second metal interconnection 15d is connected to second polycrystalline silicon interconnection 4d through a first via hole 9d. First metal interconnection 15d is electrically connected to a first metal interconnection 5i extending in the X direction through second polycrystalline silicon interconnection 4d in contact hole 9d. This second metal interconnection 15d constitutes the other bit line.

First metal interconnection 5i is connected to an active region 3b extending in the Y direction through a contact hole 8i. A second metal interconnection 15e extending in the Y direction is arranged parallel to active region 3b. Second metal interconnection 15e is connected to active region 3b through a contact hole 8k formed in active region 3b. Second metal interconnection 15e constitutes a ground line transmitting the ground voltage.

A first polycrystalline silicon interconnection 6d extending in the X direction is arranged between third metal interconnection 7a and first metal interconnection 5i. First polycrystalline silicon interconnection 6d is connected to a second polycrystalline silicon interconnection 4f through a contact hole 81. Second polycrystalline silicon interconnection 4f is connected to third metal interconnection 7a through a second via hole 10b.

First polycrystalline silicon interconnection 6c connected to active region 2a through contact hole 8b is arranged extending in the X direction so as to cross active region 3b. Active region 3b is connected to first metal interconnection 5d through a contact hole 8j. First metal interconnection 5d is connected to active region 2b through contact hole 8c, and is connected to gates of P- and N-channel MOS transistors, which are formed in active regions 2a and 3a, respectively.

First metal interconnection 5k is connected to active region 3a through contact hole 8h, and is connected to first polycrystalline silicon interconnection 6c through contact hole 8b. First polycrystalline silicon interconnection 6c constitutes gates of P- and N-channel MOS transistors that are formed in active regions 2b and 3b, respectively.

As shown in FIG. 2, in the normal memory cell region, interconnection patterns are arranged point-symmetrically with respect to a regions for forming the P-channel MOS transistors. The memory cell pattern is repeatedly arranged in row and column direction with the pattern alternately reversed. Therefore, patterning of the memory cells can be made accurately without influences such as a pattern deviation.

Figure 3:
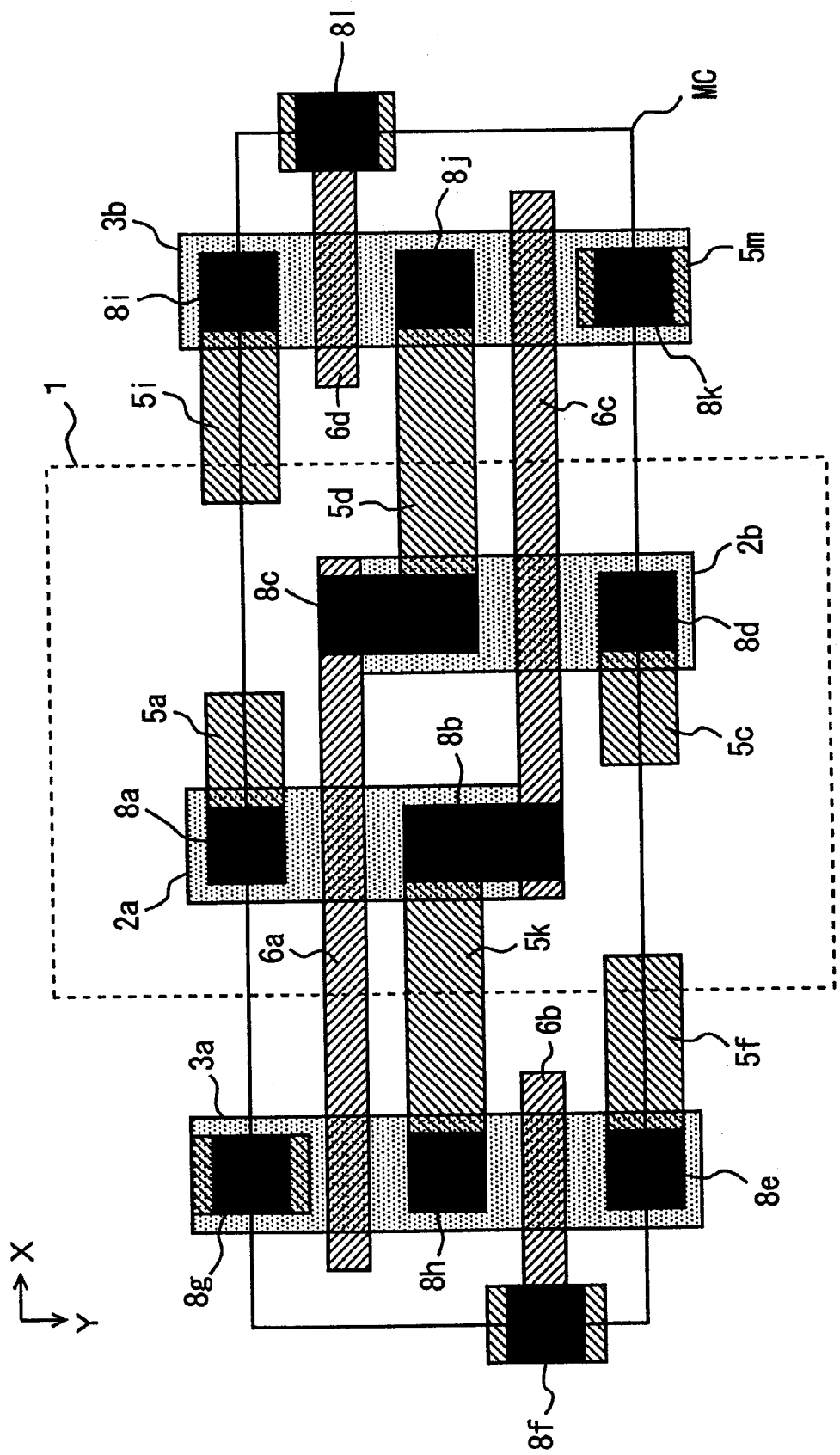
FIG. 3 shows a layout of lower layer interconnection in the layout shown in FIG. 2.

FIG. 3 shows a layout of the diffusion (active) regions up to contact holes in the layout shown in FIG. 2. In FIG. 3, rectangular active regions 2a and 2b each extending in the Y direction are formed apart from each other in N-well region 1. Active region 2a is connected to first metal interconnection 5a extending in the X direction through contact hole 8a. Active region 2a is also connected to first metal interconnection 5k extending in the X direction through contact hole 8b. First metal interconnection 5k is connected to active region 3a through contact hole 8h.

Active region 3a is connected through upper side contact hole 8g and a first metal interconnection to a second metal interconnection constituting a ground line at an upper layer. Active region 3a is connected to a first metal interconnection 5f extending in the X direction through a lower side contact hole 8e. First polycrystalline silicon interconnection 6b extending in the X direction is arranged between first metal interconnections 5k and 5f to form the gate of the access transistor. First polycrystalline silicon interconnection 6b is connected to a first metal interconnection through contact hole 8f. The first metal interconnection at contact hole 8f forms an intermediate layer for connection to a third metal interconnection forming a word line.

Active region 2b is connected to first metal interconnection 5c extending in the X direction through contact hole 8b, and is connected through an upper side contact hole 8c to first polycrystalline silicon interconnection 6a and first metal interconnection 5d, which extend in the X direction.

Active region 3b is connected to first metal interconnection 5i extending in the X direction through contact hole 8i, and is connected to first metal interconnection 5d through contact hole 8j. A first metal interconnection 5m formed at contact hole 8k, which is formed at the lower side active region 3b, is used for connection to an upper layer second metal interconnection forming a ground line.

A first polycrystalline silicon interconnection 6d extending in the X direction is formed across active region 3b and between first metal interconnections 5i and 5d. First polycrystalline silicon interconnection 6d is connected to a first metal interconnection through contact hole 81. This first metal interconnection formed at contact hole 81 is used for connection to a third metal interconnection forming the word line.

The contact hole is arranged for making a connection between the first metal interconnection and the active region as well as a connection between the first metal interconnection and the first polycrystalline silicon interconnection. The first via hole is formed for making a connection between the first and second metal interconnections, and the second via hole is formed for making a connection between the third and second metal interconnections.

Figure 4:
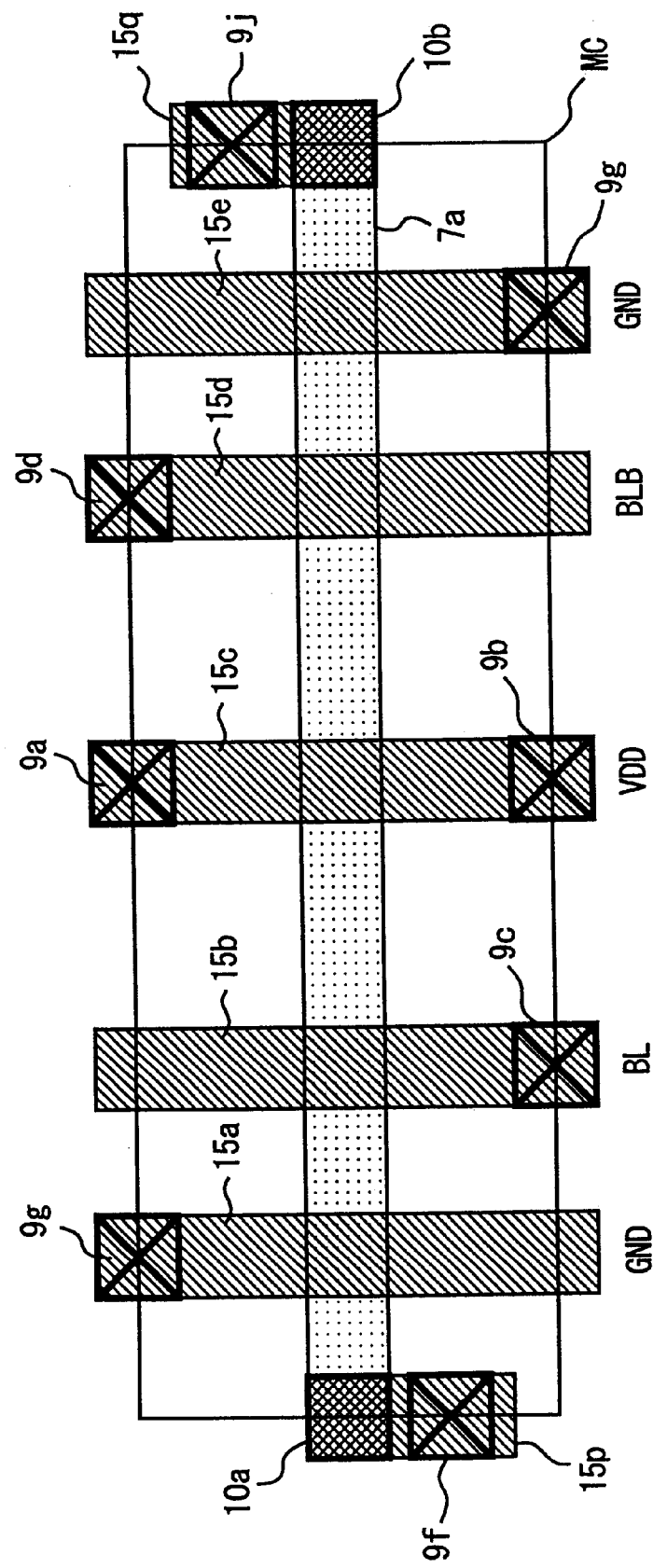
FIG. 4 shows a layout of upper layer interconnection in the layout shown in FIG. 2.

FIG. 4 schematically shows a layout of the first via holes 9 up to the third metal interconnection 7a. In FIG. 4, second metal interconnections 15a, 15b, 15c, 15d and 15e are arranged extending in the Y direction. Second metal interconnection 15a is electrically connected to contact hole 8g below a first via hole 9g. Second metal interconnection 15a transmits ground voltage GND. Second metal interconnection 15b is connected to first metal interconnection 5f shown in FIG. 2 through first via hole 9c. Second metal interconnection 15b constitutes a normal bit line.

Second metal interconnection 15c is connected to first metal interconnections 5a and 5c shown in FIG. 3 through first via holes 9a and 9b, which are located on its opposite ends in the Y direction. Second metal interconnection 15c transmits power supply voltage VDD.

Second metal interconnection 15d is connected to first metal interconnection 5i shown in FIGS. 2 and 3 through first via hole 9d. Second metal interconnection 15d constitutes another normal bit line.

Second metal interconnection 15e is connected to contact hole 8k shown in FIGS. 2 and 3 through first via hole 9g. Second metal interconnection 15e transmits ground voltage GND.

Third metal interconnection 7a is connected to second via holes 10a and 10b, which are formed at the opposite ends in the X direction of normal memory cell MC, to second metal interconnections 15p and 15q extending in the Y direction, respectively. These second metal interconnections 15p and 15q are connected through first via holes 9f and 9j to contact holes 8f and 81 shown in FIGS. 2 and 3, respectively.

The layouts shown in FIGS. 2, 3 and 4 are similar to those of memory cells disclosed, e.g., in Japanese Patent Laying-Open Nos. 9-270468, 10-178110 and 2001–28401.

Figure 5:
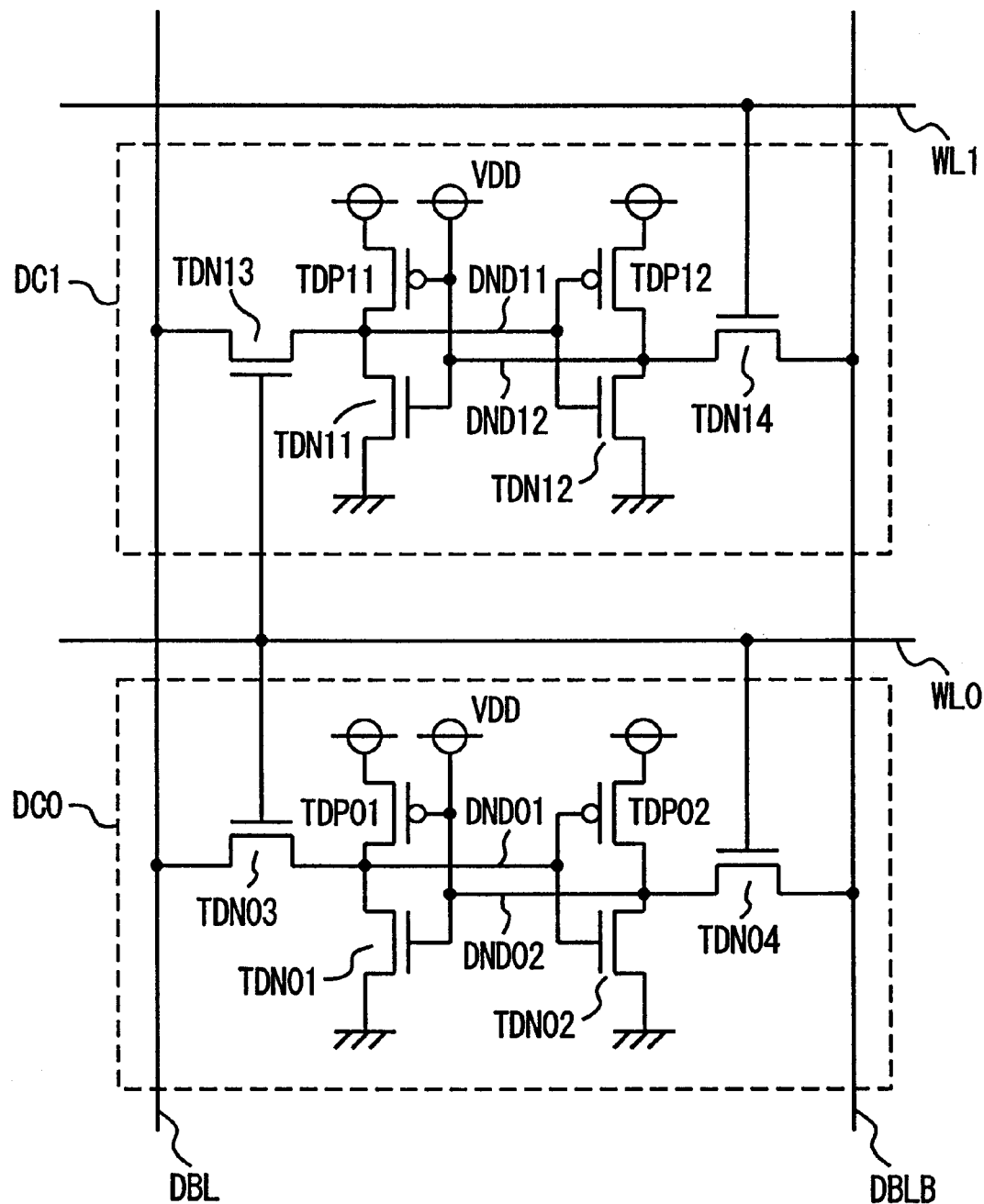
FIG. 5 shows an electrically equivalent circuit of dummy cells according to the first embodiment of the invention.

FIG. 5 shows structures of dummy cells according to a first embodiment of the invention. FIG. 5 representatively shows dummy cells DC0 and DC1 arranged in two rows and one column.

Dummy cell DC0 includes N-channel MOS transistors (driver transistors) TDN01 and TDN02 for storing data, P-channel MOS transistors TDP01 and TDP02 for pulling up internal storage nodes DND01 and DND02, respectively, and N-channel MOS transistors TDN03 and TDN04 rendered conductive to connect storage nodes DND01 and DND02 to dummy bit lines DBL and DBLB, respectively in response to a signal on word line WL0.

MOS transistors TDP01 and TDN01 are supplied on their gates with power supply voltage VDD. In dummy cell DC0, therefore, storage node DND01 always stores L-level data, and storage node DND02 always stores H-level data.

Likewise, dummy cell DC1 includes N-channel MOS transistors (driver transistors) TDN11 and TDN12 for storing data, P-channel MOS transistors TDP11 and TDP12 for pulling up storage nodes DND11 and DND12, respectively, and N-channel MOS transistors TDN13 and TDN14 for access. N-channel MOS transistor TDN13 for access (which will be referred to as the "access transistor" hereinafter) is turned on to connect storage node DND11 to dummy bit line DBL in response to the signal on word line WL0. Access transistor TDN14 is turned on to connect storage node DND12 to dummy bit line DBLB in response to a signal on word line WL1.

In dummy cell DC1, MOS transistors TDP11 and TDN1 are supplied on their gates with power supply voltage VDD, storage node DND11 stores L-level data, and storage node DND12 stores H-level data. When word line WL0 is selected, therefore, access transistors TDN03 and TDN13 of dummy cells DC0 and DC1 are simultaneously turned on, and these dummy cells DC1 and DC0 drive dummy bit line DBL to the ground voltage level.

An operation of the dummy cell shown in FIG. 5 will now be described briefly.

In an initial state, dummy bit lines DBL and DBLB are precharged to H-level in advance. Word lines WL0 and WL1 are in a non-selected state and at L level. In the initial state, access transistors TDN03, TDN04, TDN13 and TDN14 are all off. N-channel MOS transistors TDN01 and TDN11 for data storage (referred to as "driver transistors" hereinafter) are on, and driver transistors TDN02 and TDN12 are off.

When the read operation starts, the word line arranged at an addressed row is driven to a selected state in accordance with a received address signal. It is now assumed that word line WL0 is driven to the selected state, and has a voltage level thereon changed from L level to H level. In this state, access transistors TDN03 and TDN04 of dummy cell DC0 turns to an on state, access transistor TDN13 of dummy cell DC1 turns from the off state to the on state, and access transistor TDN14 maintains the off state.

Dummy bit line DBL is connected to the ground node through driver transistors TDN03 and TDN01 with a low resistance, and is also connected to the ground node through driver transistors TDN13 and TDN11 with a low resistance. Therefore, the voltage level of dummy bit line DBL gradually lowers from H level of the precharged voltage toward the ground voltage.

Driver transistor TDN02 is off, and storage node DND02 is at the power supply voltage level. Therefore, even when access transistor TDN04 is turned on, dummy bit line DBLB does not change its voltage level, and maintains the precharged voltage level.

When it is detected that the voltage level of dummy bit line DBL changes from H level to L level, the sense amplifier is activated to amplify the data of the selected memory cell in response to this detection, the voltage level of selected word line WL falls, and word line WL0 returns to the deselected state. In response to transition of word line WL0 to the deselected state, access transistors TDN03, TDN04 and TDN13 are turned off, and dummy bit line DBL is electrically isolated from the ground node. Thereafter, dummy bit line DBL is precharged again, and returns to H level for a next operation.

Now, a read operation in a case when the voltage level of word line WL1 changes from L level to H level will be described.

When word line WL1 is driven to the selected state, access transistor TDN14 in dummy cell DC1 is turned on. Other transistor TDN13 in dummy cell DC1 and access transistors TDN03 and TDN04 in dummy cell DC0 are all off. Storage node DND12 of dummy cell DC1 is connected to dummy bit line DBLB through access transistor TDN14 of a low resistance. However, storage node DND12 is kept at the level of power supply voltage VDD, and the precharged voltage level of dummy bit line DBLB is at H-level of the power supply voltage. Therefore, the voltage level of dummy bit line DBLB does not change.

The voltage level of dummy bit line DBL does not change, and is equal to the precharged voltage level because both access transistors TDN03 and TDN13 are off.

The dummy circuit shown in FIG. 5 basically operates as described above. The dummy cells are arranged in two columns for detecting the voltage level of dummy bit line DBL. The voltage level is detected by selectively using dummy bit lines DBL0 and DBL1, of which voltage levels change in response to selection of even-and odd-numbered word lines, respectively. Thereby, the reading out of memory cell data can be reliably detected.

In particular, when the dummy cells arranged in each column are equal in number to the normal memory cells in each column, the load of dummy bit line DBL can be equal to the load of normal bit line BL. Thus, the discharging of dummy bit line DBL is performed at a higher rate than the discharging of the normal bit line. Therefore, a read starting signal can be produced by discharging the dummy bit line at high speed.

Further, the potential on the dummy bit line can be determined at a faster timing so that a large margin can be secured for the activation timing of the sense amplifier, and the sense amplifier activation timing can be optimized. A discharging time period of the bit line can be reduced so that current consumption by the charging and discharging of the bit lines can be reduced.

Figure 6:
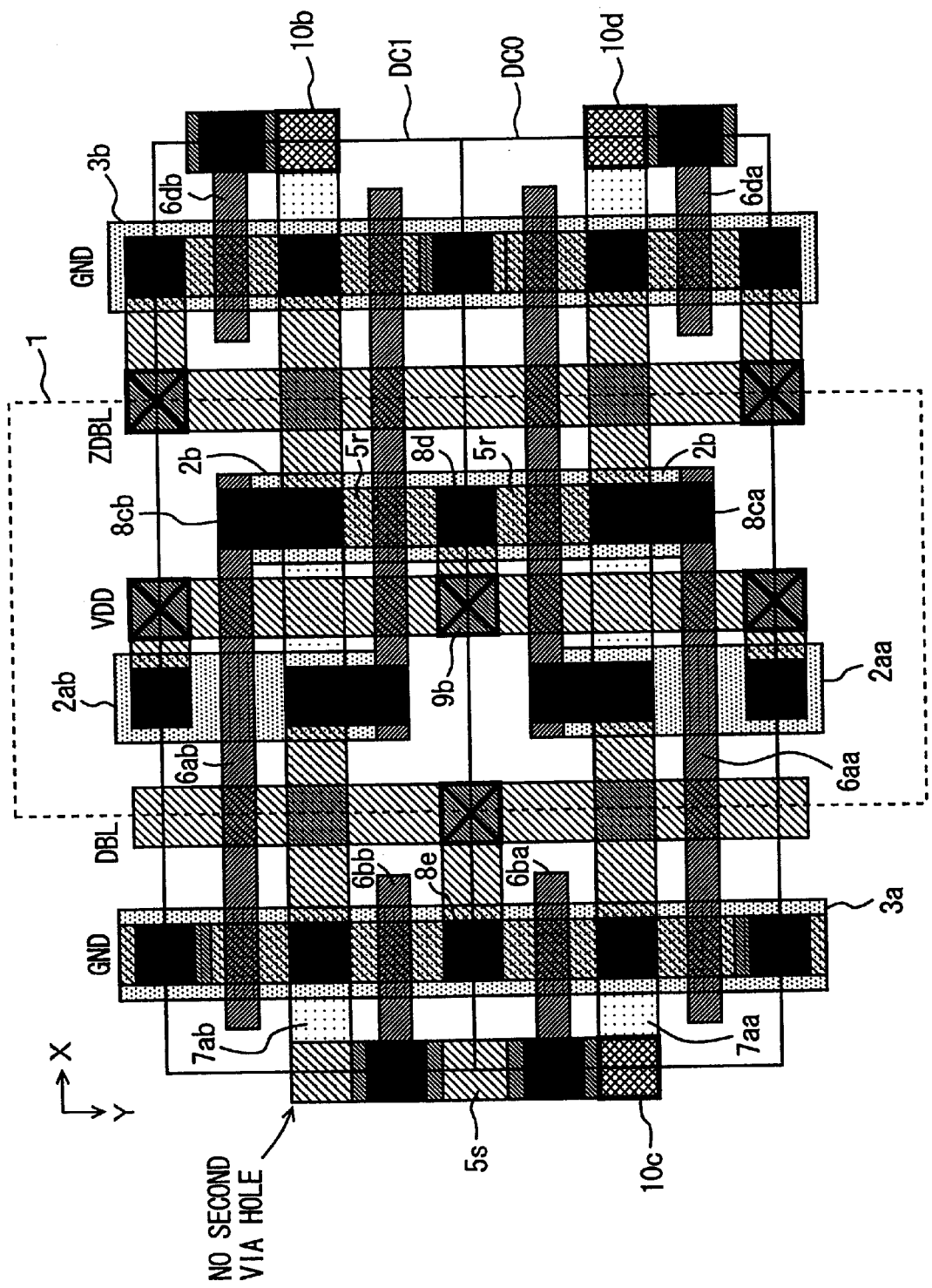
FIG. 6 shows a layout of the dummy cells shown in FIG. 5.

FIG. 6 schematically shows a layout of the dummy cell. In FIG. 6, portions corresponding to constituent elements of the normal memory cell shown in FIG. 2 are allotted with the same reference characters, and description thereof is not repeated.

Layouts of dummy cells DC0 and DC1 are the same as those of the normal memory cells shown in FIG. 2. However, the access transistors of both dummy cells DC0 and DC1 are turned on when word line WL0 is selected, and dummy bit line DBL is discharged by the driver transistors when selected. For implementing these operations, the following constituent elements are additionally provided.

In active region 2b, a first metal interconnection 5r is arranged between contact holes 8cb and 8ca. A second metal interconnection for transmitting power supply voltage VDD is connected to contact hole 8d through first via hole 9b and a first metal interconnection. First metal interconnection 5r extending in the X direction is connected to the first metal interconnection constituting the storage node and to the first polycrystalline silicon interconnection constituting the gate through contact holes 8cb and 8ca formed in active region 2b. First metal interconnection 5r supplies a power supply voltage to the gates of one of the load MOS transistors and one of the driver transistors in the dummy cell, and supplies the power supply voltage to source/drain of the other load MOS transistor.

Through a contact hole 8cb formed in active region 2b, a first polycrystalline silicon interconnection 6ab is connected to active region 2b, and is connected to a first polycrystalline silicon interconnection 6aa through a contact hole 8ca. First polycrystalline silicon interconnection 6ab extends in the X direction to constitute a gate of the driver transistor. First polycrystalline silicon interconnection 6aa constitutes a gate of the driver transistor of dummy cell DC0.

In each of active regions 2ab and 2aa, a P-channel MOS transistor is formed, and is supplied on its source region with power supply voltage VDD.

In dummy cell DC1, at a right end in FIG. 6, a second via hole 10b is provided for a third metal interconnection 7ab extending in the X direction. Through this second via hole 10b as well as second polycrystalline silicon and a contact hole, third metal interconnection 7ab is connected to first polycrystalline silicon interconnection 6db. On the left side in FIG. 6, a second via hole is not formed for third metal interconnection 7ab.

At the opposite ends of a third metal interconnection 7aa for dummy cell DC0, second via holes 10c and 10d are formed, respectively. Third metal interconnection 7aa is connected to a second metal interconnection 6ba through second via hole 10d, second a polycrystalline silicon interconnection and a contact hole.

Second via hole 10c formed in the left portion of third metal interconnection 7aa is connected to a second metal interconnection 15s extending in the Y direction, which in turn is connected to first polycrystalline silicon interconnections 6ba and 6bb through contact holes.

In dummy cells DC0 and DC1, access transistors for dummy bit line DBL have the gates commonly connected to third metal interconnection 7ab through second metal interconnection 15s, and both are simultaneously turned on.

Contact hole 8e arranged in active region 3a is shared between the access transistors of dummy cells DC1 and DC0, and is coupled to dummy bit line DBL through a second via hole. A second metal interconnection for transmitting ground voltage GND is arranged, parallel to and above active regions 3a and 3b, extending in the Y direction.

Figure 7:
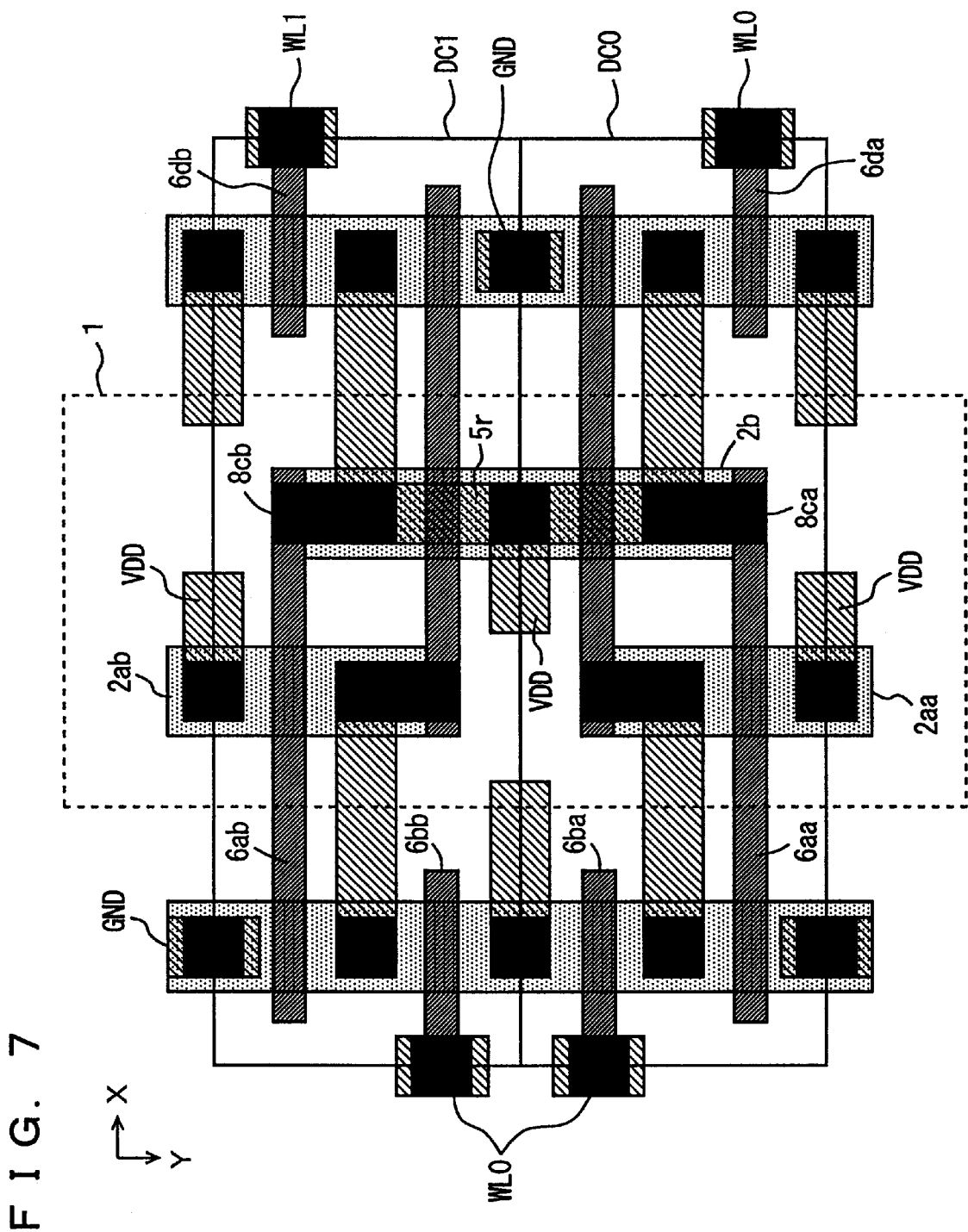
FIG. 7 shows a layout of a lower layer interconnection in the layout shown in FIG. 6.

FIG. 7 shows a layout of the active regions up to the second interconnections in the layout shown in FIG. 6. The layout shown in FIG. 7 differs from the layout of the normal memory cell shown in FIG. 3 in that first metal interconnection 5r parallel to active region 2b is additionally provided. First metal interconnection 5r is connected through contact holes 8ca and 8cb to first polycrystalline silicon interconnections 6aa and 6ab extending in the X direction, respectively. The layout of the dummy cell shown in FIG. 7 is the same as the layout of the normal memory cell shown in FIG. 3 except for the provision of first metal interconnection 5r.

In the layout shown in FIG. 7, first polycrystalline silicon interconnections 6ba and 6bb extending in the X direction are connected to word line WL0, and first polycrystalline silicon interconnections 6da and 6db are connected to word lines WL0 and WL1, respectively.

In FIG. 7, therefore, the access transistors arranged to the dummy bit line DBL shown in FIG. 7 in dummy cells DC0 and DC1 are simultaneously driven to the selected state when word line WL0 is selected. The access transistors arranged to complementary dummy bit line DBLB shown in FIG. 7 in dummy cells DC0 and DC1 are turned on in response to selection of word lines WL0 and WL1, respectively.

Figure 8:
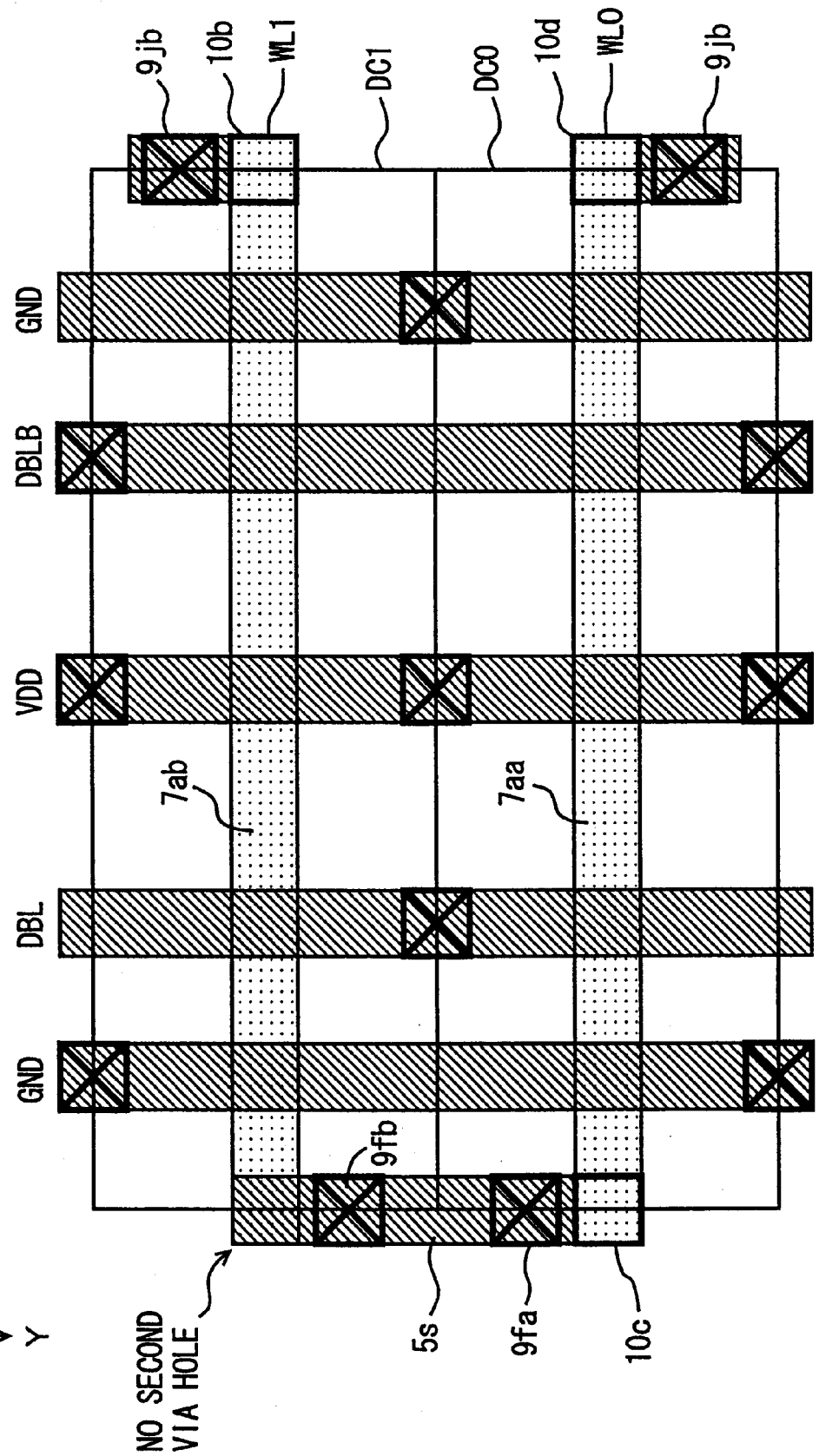
FIG. 8 shows a layout of an upper layer interconnection in the layout shown in FIG. 6.

FIG. 8 shows a layout of the first via holes up to the third metal interconnections in the layout of the dummy cells shown in FIG. 6. In the layout shown in FIG. 8, third metal interconnection 7aa is connected to second metal interconnection 15s through second via hole 10c. Second metal interconnection 15s extends in the Y direction, and is connected to a first metal interconnection at a lower layer through first via holes 9fa and 9fb arranged in dummy cells DC0 and DC1, respectively. The second via hole is not arranged in a crossing portion of second and third metal interconnections 15s and 7ab. Third metal interconnection 7ab is connected through second and first via holes 10b and 9jb to a second metal interconnection connected to a first polycrystalline silicon interconnection through a contact hole. Third metal interconnection 7ab constitutes word line WL1.

Third metal interconnection 7aa extending in the X direction is connected to second metal interconnections through second via holes 10c and 10d arranged at the opposite ends thereof, respectively. Third metal interconnection 7aa is connected through second and first via holes 10d and 9jb to a second metal interconnection, which in turn is connected through first via hole 9jb to a first polycrystalline silicon interconnection at a lower layer.

As the second metal interconnections, there are arranged a power supply line for transmitting power supply voltage VDD, dummy bit lines DBL and DBLB arranged on the opposite sides of the power supply line, and ground lines arranged outside dummy bit lines DBL and DBLB for transmitting ground voltage GND. These second metal interconnections are arranged extending in the Y direction.

Figure 9:
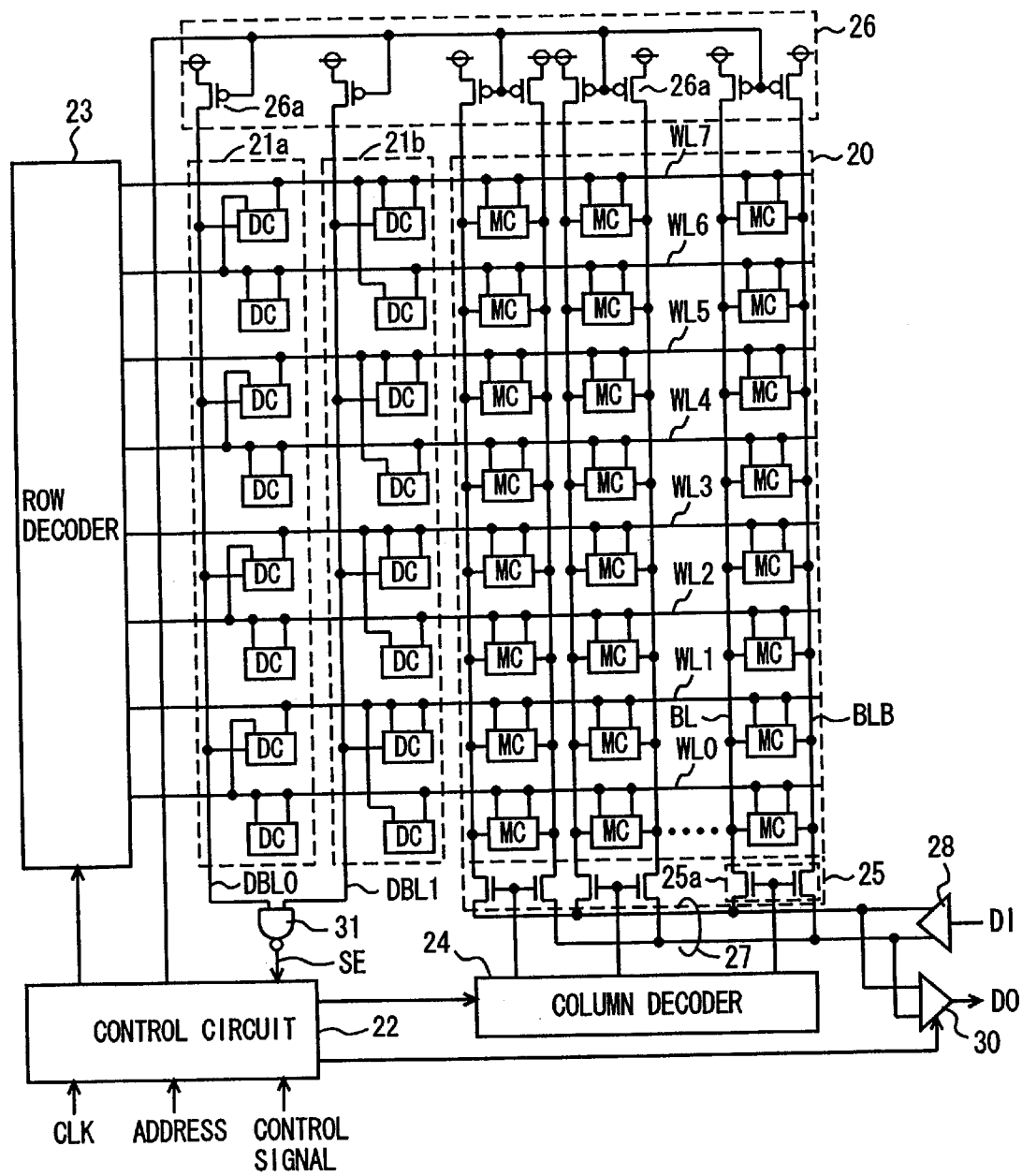
FIG. 9 schematically shows a whole structure of a semiconductor memory device according to the first embodiment of the invention.

FIG. 9 schematically shows a whole structure of a semiconductor memory device according to a first embodiment of the invention. In FIG. 9, the semiconductor memory device includes a normal memory cell array 20 having normal memory cells MC arranged in rows and columns, and dummy cell columns 21a and 21b each including dummy cells DC aligned in the column direction. In normal memory cell array 20 and dummy cell columns 21a and 21b, normal memory cells MC and dummy cells DC are arranged in alignment in the row direction. Word line WL is arranged corresponding to each of the rows of normal memory cells MC and dummy cells DC. FIG. 9 representatively shows word lines WL0–WL7.

Word line WL is connected to the normal memory cells and dummy cells. Normal memory cells MC connected to normal bit line pair BL and BLB are equal in number to dummy cells DC connected to the dummy bit lines. Even if the array structure is changed, the dummy cells and normal memory cells are aligned in the row direction, and a word line can be arranged commonly to normal memory cells and dummy cells. The discharging speed of dummy bit line DBL can always be faster than that of the normal bit line, and the internal timing can be reliably set in accordance with the potential on the dummy bit line.

For each column of normal memory cells MC, normal bit lines BL and BLB are arranged correspondingly. In dummy cell columns 21a and 21b, dummy bit lines DBL0 and DBL1 are arranged, respectively. In normal memory cell array 20, normal bit lines BL and BLB are arranged in pairs. In dummy cell columns 21a and 21b, only dummy bit lines DBL0 and DBL1 are used, respectively.

For dummy bit lines DBL0 and DBL1, complementary dummy bit lines DBLB0 and DBLB1 are arranged, respectively. However, the voltages of these complementary dummy bit lines DBLB0 and DBLB1 are at the precharged voltage level, and are not used for controlling an internal operation.

Dummy cells DC in dummy cell column 21a discharge dummy bit line DBL0 by two dummy cells DC when an even-numbered word line WL0, WL2 or others is selected. When an odd-numbered word line WL1, WL3 or the like is selected, two dummy cells DC adjacent to each other in the column direction are selected in dummy cell column 21b, and discharge dummy bit line DBL1.

As an array peripheral circuit, a precharge circuit 26 is further provided for precharging dummy bit lines DBL0 and DBL1 as well as bit lines BL and BLB to the power supply voltage level when activated. Precharge circuit 26 includes P-channel MOS transistors 26a provided for dummy bit lines DBL0 and DBL1, and normal bit lines BL and BLB, respectively.

When a memory cell is selected, precharge circuit 26 is deactivated for reducing current consumption.

For normal memory cell array 20, a multiplexer 25 is provided for connecting an addressed column to an internal data bus 24 in accordance with a column select signal applied from a column decoder 24. Multiplexer 25 includes column select gates 25a arranged corresponding to the normal bit line pairs, respectively. Column select gates 25a are selectively made conductive in response to the column select signal applied from column decoder 24.

This semiconductor memory device further includes a control circuit 22 that receives a clock signal CLK, an address signal and a control signal, and produces an internal address signal and an operation timing signal, a row decoder 23 that drives the word line of an addressed row to the selected state in accordance with the internal row address signal and a row activating signal applied from control circuit 22, and a potential detecting circuit 31 for detecting a change in potential on dummy bit lines DBL0 and DBL1. Potential detecting circuit 31 is formed of, e.g., a NAND gate. Potential detecting circuit 31 is merely required to detect the change in potential on dummy bit lines DBL0 and DBL1, and may be formed of another gate circuit.

In accordance with an output signal (read signal) SE generated from potential detecting circuit 31, control circuit 22 determines the read operation timing and word line deactivation timing.

For executing writing and reading of internal data, there are provided a write driver 28 for driving internal data bus 27 in accordance with internal data DI and a sense amplifier 30 selectively activated under the control of control circuit 22, to amplify the data read onto internal data bus 27. Output signal SE of potential detecting circuit 31 determines the activation timing of sense amplifier 30. Internal data bus 27 is formed of a complementary data signal line pair. Sense amplifier 30 differentially amplifies the potentials on this complementary data signal line pair to produce the internal read data when made active.

Figure 10:
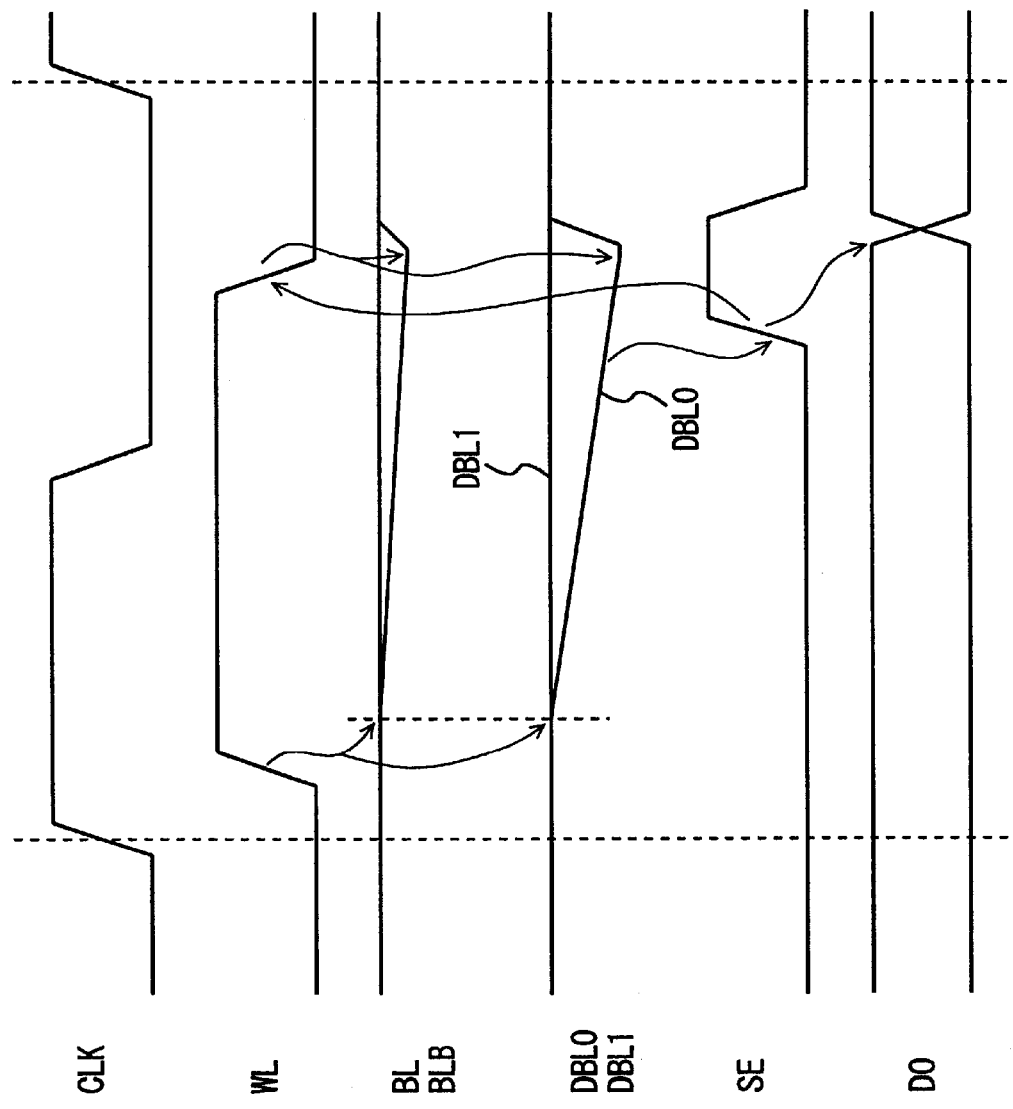
FIG. 10 is a signal waveform diagram representing an operation of the semiconductor memory device according to the first embodiment of the invention.

FIG. 10 shows signal waveforms in a data read operation of the semiconductor memory device shown in FIG. 9. Referring to FIG. 10, an operation of the semiconductor memory device shown in FIG. 9 will now be described briefly.

This semiconductor memory device has an operation mode designated by control signals provided in synchronization with clock signal CLK. Before the data access instruction is applied, precharge circuit 26 is active, and normal bit lines BL and BLB as well as dummy bit lines DBL0 and DBL1 are precharged at the power supply voltage level. All word lines WL0–WL7 are in a deselected state, and have the voltages thereon at L level. Since the voltages on dummy bit lines DBL0 and DBL1 are at H level, read signal SE provided by voltage detecting circuit 31 is at L level.

It is assumed that clock signal CLK rises, and the control signals at the rising of the clock signal designate the read operation. In this case, control circuit 22 deactivates precharge circuit 26 in accordance with an access instruction. Concurrently, row and column decoders 23 and 24 are supplied with an internal row address signal and an internal column address signal, respectively. Row decoder 23 drives the word line corresponding to an addressed row to the selected state, and column decoder 24 produces the column select signal for selecting an addressed column.

The voltage level of the word line corresponding to the addressed row rises from L level to H level in accordance with the row select signal generated from row decoder 23, and the data of the normal memory cell connected to this selected word line is transmitted to corresponding normal bit lines BL and BLB. In accordance with the column select signal applied from column decoder 24, column select gate 25a corresponding to the addressed column turns on in multiplexer 25, and normal bit lines BL and BLB corresponding to the selected column are coupled to internal data bus 27.

In dummy cell columns 21a and 21b, the storage node of the dummy cell is connected to one of dummy bit lines DBL0 and DBL1 in accordance with the selected word line. It is now assumed that word line WL0 is selected. The data of normal memory cell MC connected to selected word line WL0 is read onto normal bit lines BL and BLB. Thereby, the potential on one of normal bit lines BL and BLB gradually lowers in accordance with the storage data of the memory cell.

At the same timing as the data reading of the normal memory cell, dummy cells DC connected to selected word line WL0 discharge dummy bit line DBL0. Since this discharging is performed by the dummy cells of two bits, the potential on dummy bit line DBL0 changes more rapidly than the potential on normal bit line BL or BLB changes. In dummy cell column 21b, all dummy cells DC are not selected so that dummy bit line DBL1 maintains the precharged voltage level.

When the voltage level of dummy bit line DBL0 lowers to or below an input logical threshold voltage of voltage detecting circuit 31, read signal SE provided by voltage detecting circuit 31 changes from L level to H level.

Control circuit 22 activates sense amplifier 30 in response to rising of read signal SE. Sense amplifier 30, when activated, differentially amplifies the data supplied to internal data bus 27, and produces read data DO.

In response to the rising of read signal SE, control circuit 22 drives word line WL0 in the selected state to the deselected state, and activates precharge circuit 26 to precharge dummy bit lines DBL0 and DBL1 as well as normal bit lines BL and BLB to the power supply voltage level again. In this precharge operation, the column decoder is deactivated, and multiplexer 25 is made non-conductive.

When odd-numbered word line WL1 is selected, the data of normal memory cell MC connected to word line WL1 is read onto the pair of bit lines BL and BLB, and one of paired bit lines BL and BLB gradually lowers. At the same timing, dummy cell DC connected to word line WL1 is driven to the selected state, and the selected dummy cell lowers the potential on dummy bit line DBL1. Similarly to the foregoing case, the potential on dummy bit line DBL1 lowers more rapidly than the potential on normal bit line BL or BLB does.

When the voltage level of dummy bit line DBL1 becomes lower than the input logical threshold voltage of voltage detecting circuit 31, the read signal SE provided by voltage detecting circuit 31 attains the H level. Thereafter, control circuit 22 executes the control similar to that made when word line WL0 is selected, in response to the rising of read signal SE. Thus, sense amplifier 30 is activated in response to the rising of read signal SE, and senses the data read from bit lines BL and BLB on the selected column onto internal data bus 27 for making internal read data DO definite.

In response to read signal SE, word line WL1 in the selected state is driven to the deselected state, and precharge circuit 26 is activated. Also, multiplexer 25 is deactivated.

Accordingly, when the even-numbered word line is selected, the dummy cells in dummy cell column 21a are selected, to discharge dummy bit line DBL0 for activating read signal SE. When the odd-numbered word line is selected, the dummy cells in dummy cell column 21b discharge dummy bit line DBL1 to activate read signal SE. The start timing of discharging of dummy bit lines DBL0 and DBL1 is determined by the selection timing of the word line, and is the same as the start timing of discharging of the normal bit line. Since the potential on dummy bit lines DBL0 or DBL1 changes faster than the potentials on the normal bit lines, a difference in activation timing can be made sufficiently large between read signal SE and the sense amplifier activating signal, so that the activation timing of sense amplifier 30 can be easily optimized. Further, the time duration of the selected state of the word line can be short so that the discharging period of the normal bit line can be short, and the current consumption can be reduced.

Since the dummy bit line is driven by the two dummy cells, the transistor characteristics of these two dummy cells can be averaged even when variation is present in transistor characteristics of the dummy cells. Therefore, the degree of variation in transistor characteristics can be suppressed, and the operation margin can be improved.

Figure 11:
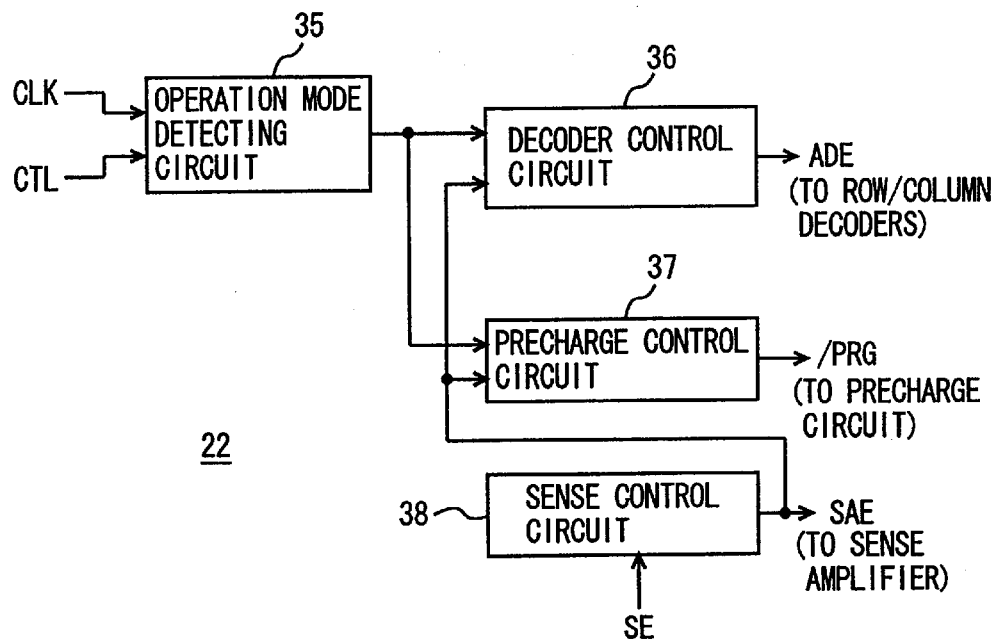
FIG. 11 schematically shows a structure of a control circuit shown in FIG. 9.

FIG. 11 schematically shows a structure of control circuit 22 shown in FIG. 9. In FIG. 11, control circuit 22 includes an operation mode detecting circuit 35 for detecting an operation mode designated in accordance with clock signal CLK and a control signal CTL, a decoder control circuit 36 for activating a decoder enable signal ADE in accordance with an access instructing signal applied from operation mode detecting circuit 35, a precharge control circuit 37 for deactivating a precharge instructing signal /PRG in accordance with an operation mode instructing signal applied from operation mode detecting circuit 35, and a sense control circuit 38 for driving a sense amplifier activating signal SAE to the active state for a predetermined period in response to the rising of read signal SE.

Decoder enable signal ADE determines the active period of row decoder 23 and column decoder 24. Precharge instructing signal /PRG determines activation and deactivation of precharge circuit 26 shown in FIG. 9. Sense amplifier activating signal SAE determines the active period of sense amplifier 30.

In response to the rising of read signal SE, sense control circuit 38 activates sense amplifier activating signal SAE at a predetermined timing, and deactivates sense amplifier activating signal SAE after elapsing of a predetermined time period.

When sense amplifier activating signal SAE turns active, decoder control circuit 36 deactivates decoder enable signal ADE after elapsing of a predetermined period of time, drives the selected word line to the deselected state, renders multiplexer 25 non-conductive to isolate the normal bit lines from internal data bus 27.

In response to activation of sense amplifier activating signal SAE, precharge control circuit 37 likewise activates precharge instructing signal /PRG to precharge the dummy bit line and normal bit line after elapsing of a predetermined period.

In the above description, precharging of dummy bit lines DBL0 and DBL1 as well as normal bit lines BL and BLB is inhibited in the data read operation. However, precharge circuit 26 may be made inactive only in the data write operation, while being kept active in the data read operation.

In the data write operation, write driver 28 is activated to drive the normal bit lines in a selected column in accordance with the write data. In this case, precharge circuit 26 is deactivated to stop the charging of the normal bit lines. The activation of write driver 28 is merely required to be at an appropriate timing after selection of the word and bit lines. Therefore, it is not particularly necessary to detect the potential on the dummy bit line for driving write driver 28.

The layout of the dummy cell and the layout of normal memory cell differ from each other only in arrangements of the metal interconnections and via holes, and do not differ from each other in features of the gates and active regions. The dummy cells connected to the dummy bit line are equal in number to the normal memory cells connected to the normal bit line. Therefore, a parasitic capacitance of the dummy bit line can be equal to a parasitic capacitance of the normal bit line, and the potential on dummy bit line can be changed accurately and faster than the potential on the normal bit line.

Since the dummy cell and the normal memory cell have the gates and active regions of the same configurations and features, the dummy cell and normal memory cell can have the same transistor characteristics, and variations in transistor characteristics can be small so that the timing adjustment can be performed easily. Variations, e.g., in threshold voltage and ratio of the channel width to the channel length of the dummy cells can be the same as those of the normal memory cells, so that a margin for the variations in these parameters can be large, and the read signal can be produced accurately to activate the sense amplifier at an optimum timing.

Second Embodiment

Figure 12:
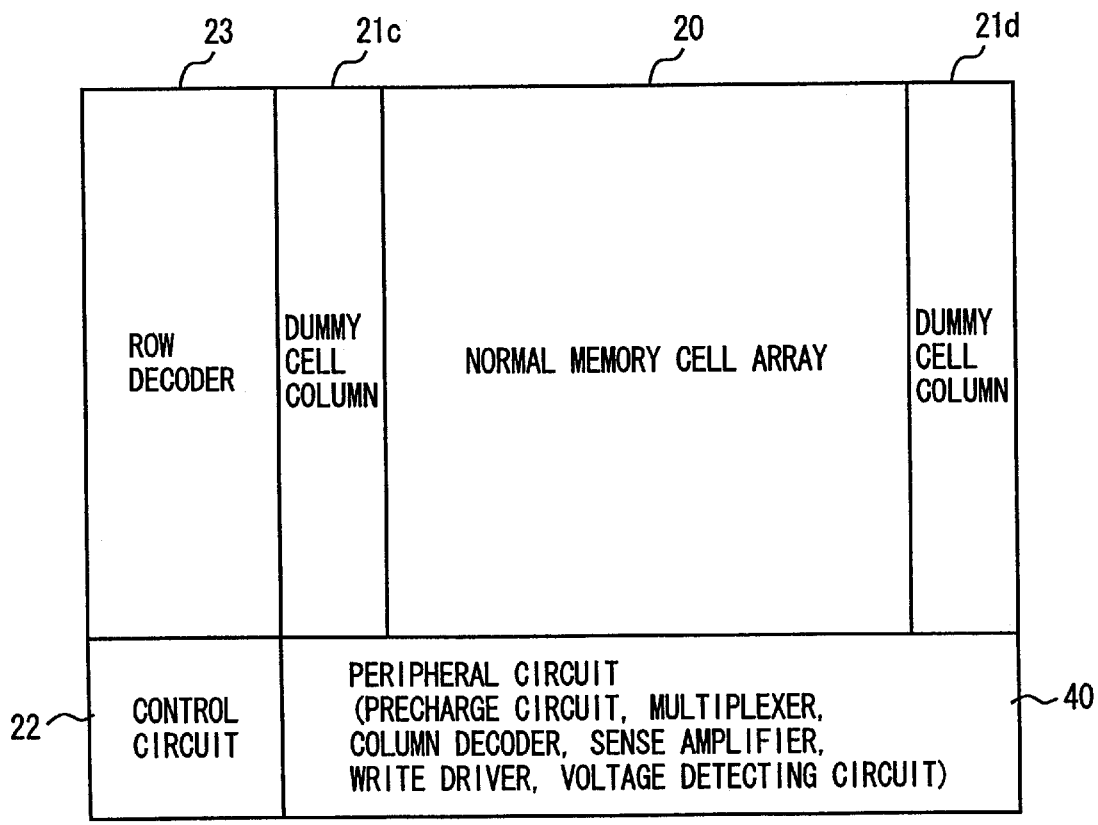
FIG. 12 schematically shows a whole structure of a semiconductor memory device according to a second embodiment of the invention.

FIG. 12 schematically shows a whole structure of a semiconductor memory device according to a second embodiment of the invention. In FIG. 12, dummy cell columns 21c and 21d are arranged on the respective opposite sides of normal memory cell array 20. Dummy cell column 21c is arranged adjacent to row decoder 23, and dummy cell column 21d is arranged at a side of normal memory cell array 20 remote from row decoder 23.

Control circuit 22 and a peripheral circuit 40 are arranged in a peripheral region of the array. Peripheral circuit 40 includes precharge circuit 26, multiplexer 25, column decoder 24, sense amplifier 30, write driver 28 and voltage detecting circuit 31 shown in FIG. 9.

In the arrangement shown in FIG. 12, voltage detecting circuit 31 detects the voltage levels of the dummy bit lines arranged in dummy cell columns 21c and 21d, which are arranged at the opposite sides in the row direction of normal memory cell array 20.

The layout of dummy cells DC arranged in dummy cell columns 21c and 21d are the same as that previously described and shown in FIGS. 6 to 8. In arranging the memory cells, the layout pattern of each memory cell is repetitively in a mirror symmetric manner in the row and column directions, with the layout of the memory cell being a unit. Accordingly, the following problem arises when the dummy cell column is arranged within normal memory cell array 20.

Figure 13:
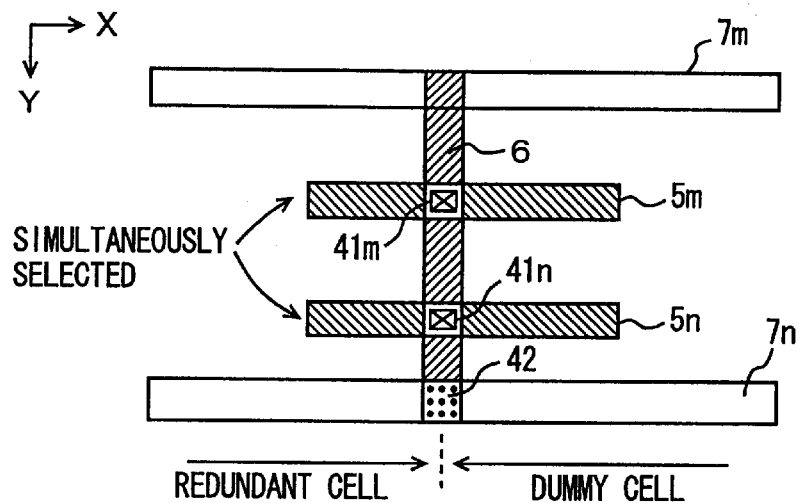
FIG. 13 schematically shows a structure of a main portion of a dummy cell of the semiconductor memory device according to the second embodiment of the invention.

FIG. 13 schematically shows a layout of the gates of access transistors in the dummy cells of two bits. Third metal interconnections 7m and 7n are arranged extending linearly in the X direction. Third metal interconnection 7m is connected to a second metal interconnection 6 extending in the Y direction through a second via hole 42. Second metal interconnection 6 is electrically connected to first polycrystalline silicon interconnections 5m and 5n at connection portions 41m and 41n, respectively. Second metal interconnection 6 merely makes a crossing with third metal interconnection 7m, and is not electrically connected to the same.

In the layout of the normal memory cells, the layout of the dummy cells is modified such that memory cell layouts are placed mirrorsymmetrically in the column direction so as to share the second metal interconnection 6 between the adjacent memory cells if first polycrystalline silicon interconnections 5m and 5n are employed for the gates of the access transistors, these first polycrystalline silicon interconnections 5m and 5n are interconnected by second metal interconnection 6, and are supplied with the selecting voltage when the word line formed of third metal interconnection 7n is selected.

In this case, in the memory cells adjacent in the X direction to the dummy cell, the memory cells of two bits are simultaneously selected. As a result, the cells adjacent in the X direction to the dummy cell are arranged as redundant cells, which cannot be utilized as the normal memory cells. In normal memory cell array 20, therefore, redundant cells, which can not be used as a dummy cell or a normal memory cell, are arranged, and the area of normal memory cell array 20 increases.

Therefore, by arranging dummy cell columns 21c and 21d on the opposite sides in the X direction of normal memory cell array 20 as shown in FIG. 12, it is not necessary to arrange the redundant cells adjacent in the X direction to the dummy cells so that it is possible to suppress the increase in area of the memory cell array including the dummy cells and the normal memory cells.

Third Embodiment

Figure 14:
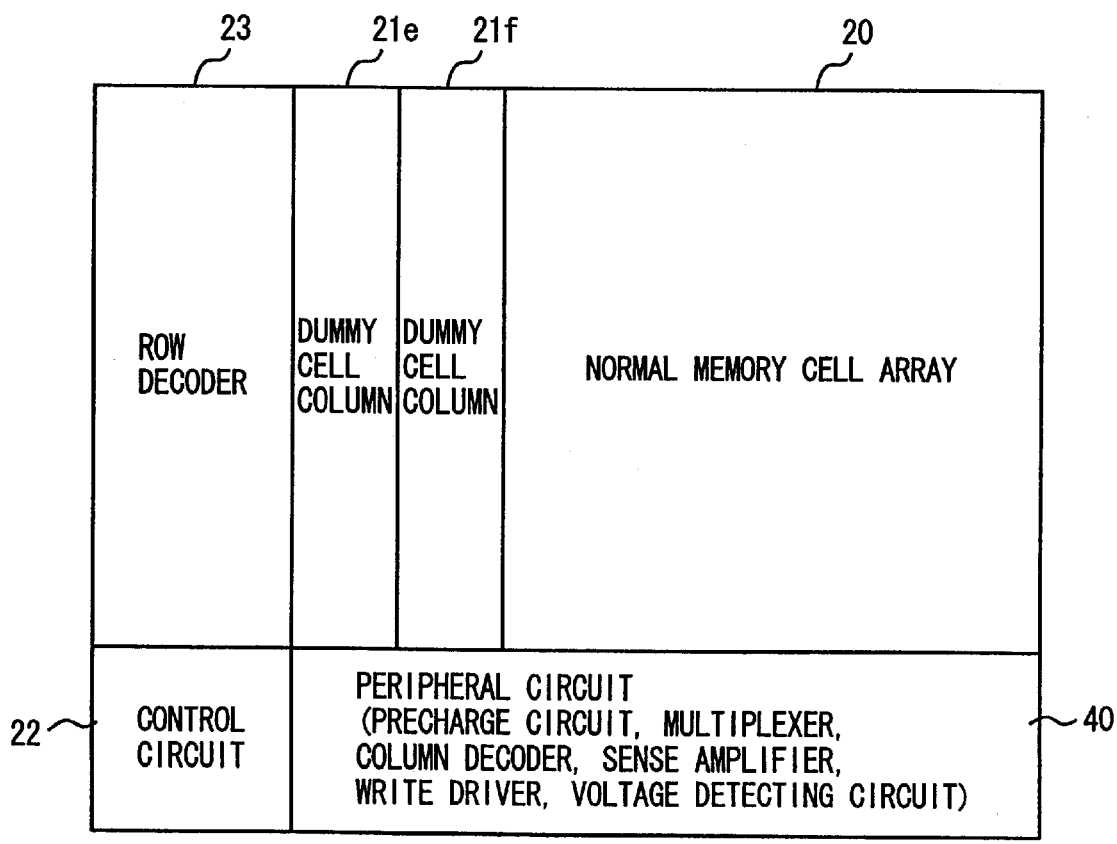
FIG. 14 schematically shows a whole structure of a semiconductor memory device according to a third embodiment of the invention.

FIG. 14 schematically shows a whole structure of a semiconductor memory device according to a third embodiment of the invention. In the structure shown in FIG. 14, dummy cell columns 21e and 21f are arranged adjacent to a side of normal memory cell array 20 near row decoder 23. Structures of the semiconductor memory device shown in FIG. 14 other than the above are the same as those shown in FIG. 12. Corresponding portions bear the same reference numerals, and description thereof is not repeated.

Figure 15:
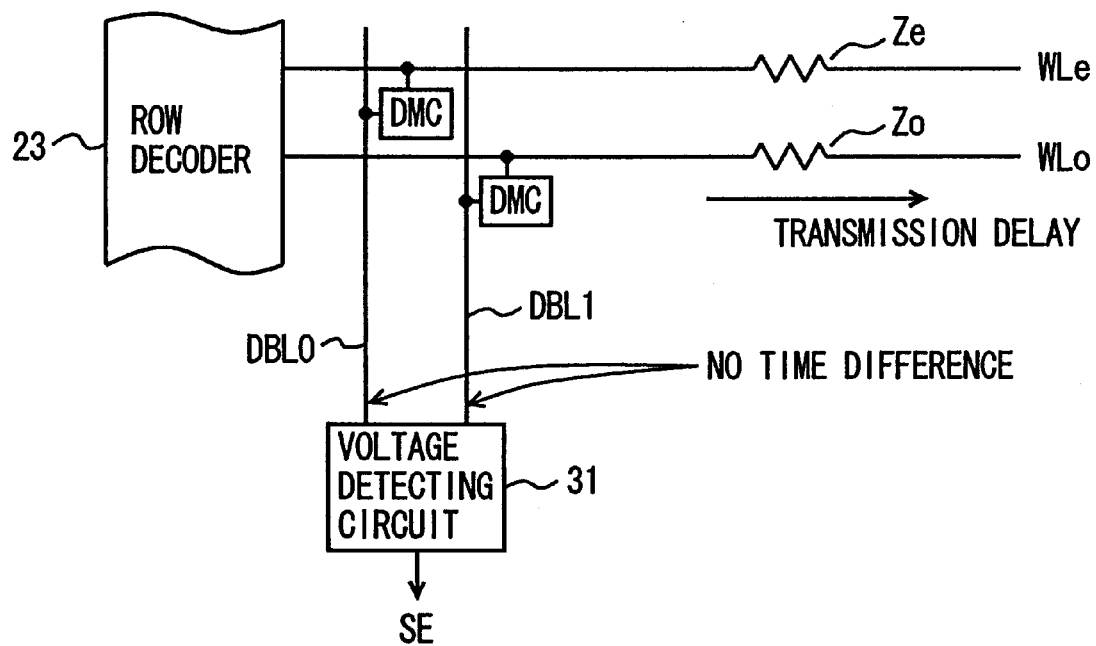
FIG. 15 schematically shows a structure of a main portion of the semiconductor memory device shown in FIG. 14.

As shown in FIG. 15, row decoder 23 is arranged at one side of the normal memory cell array and drives even- and odd-numbered word lines WLe and WLo to the selected state from the one side of the memory cell array. Interconnection resistances Ze and Zo are present in word lines WLe and WLo, respectively. Therefore, when row decoder 23 transmits the word line select signal to the selected word line, this interconnection resistance causes a delay in signal transmission on the selected word line.

However, by arranging dummy cells DMC at one side of memory cell array near row decoder 23, changing of potentials appearing on dummy bit lines DBL0 and DBL1 starts at the same timing whichever word line is selected in even- and odd-numbered word lines WLe and WLo. Therefore, voltage detecting circuit 31 can activate read signal SE at the same timing whichever is discharged in dummy bit lines DBL0 and DBL1 so that the read signal can be accurately activated at a faster timing without an influence by the delay in transmission of the word line drive signal.

By arranging dummy bit lines DBL0 and DBL1 near row decoder 23, the storage node of dummy cell DMC can be connected to dummy bit line DBL0 or DBL1 at the fastest timing when word line WLe or WLo is selected, to drive dummy bit line DBL0 or DBL1 by the dummy cell driver transistors. Accordingly, read signal SE can be activated at the fastest timing so that a sufficient margin can be ensured for the activation of the sense amplifier, and the sense amplifier can be activated at the optimum timing.

By arranging dummy cell columns 21e and 21f at the side of the memory cell array near row decoder 23, if the following structure is employed, there is no need to arrange a redundant cell column so that increase in array area can be suppressed. In dummy cells DMC connected to even-numbered word line WLe, when portions sharing the word line is commonly connected, the commonly connected portions are connected to dummy bit line DBL0. Portions having a common word line in dummy cells DMC connected to odd-numbered word line WLo, are connected to dummy bit line DBL1. Therefore, the driver transistors arranged at the dummy cell column boundary and sharing a word line are selectively set to a driver transistor connected to complementary dummy bit line DBLB0 or to dummy bit line DBL1.

Thus, in the dummy cell column boundary, the access transistor connected to complementary dummy bit line DBLB0 and access transistor connected to dummy bit line DBL1 are arranged in a mirror symmetric layout. Complementary dummy bit lines DBLB0 and DBLB1 are not used for the voltage detection, and are maintained at the power supply voltage level. Therefore, even if the dummy cells of two bits are simultaneously connected to the complementary dummy bit line, this exerts no influence on the operation of voltage detection. Therefore, by arranging two columns of the dummy cells without changing the layout, the dummy cells can be arranged without affecting the layout of the normal memory cells in the normal memory cell array.

According to the third embodiment of the invention, as described above, the dummy cell columns are arranged at the side of the memory cell array near the row decoder, and therefore, the read signal can be activated quickly regardless of the position of the selected word line. The timing margin for activation of the sense amplifier can be improved.

Since the dummy cell columns are arranged adjacently with each other at the side of the memory cell array near the row decoder, the potential on the dummy bit line can be changed to drive the read signal to the definite state at a fast timing so that the margin for the sense amplifier activation can be increased, and the sense amplifier can be activated at optimum timing.

Since the portion for connecting the dummy cells of two bits to the one word line is shared by the dummy cells, a redundant cell column is not required, and increase in area of the memory cell array can be suppressed.

Fourth Embodiment

Figure 16:
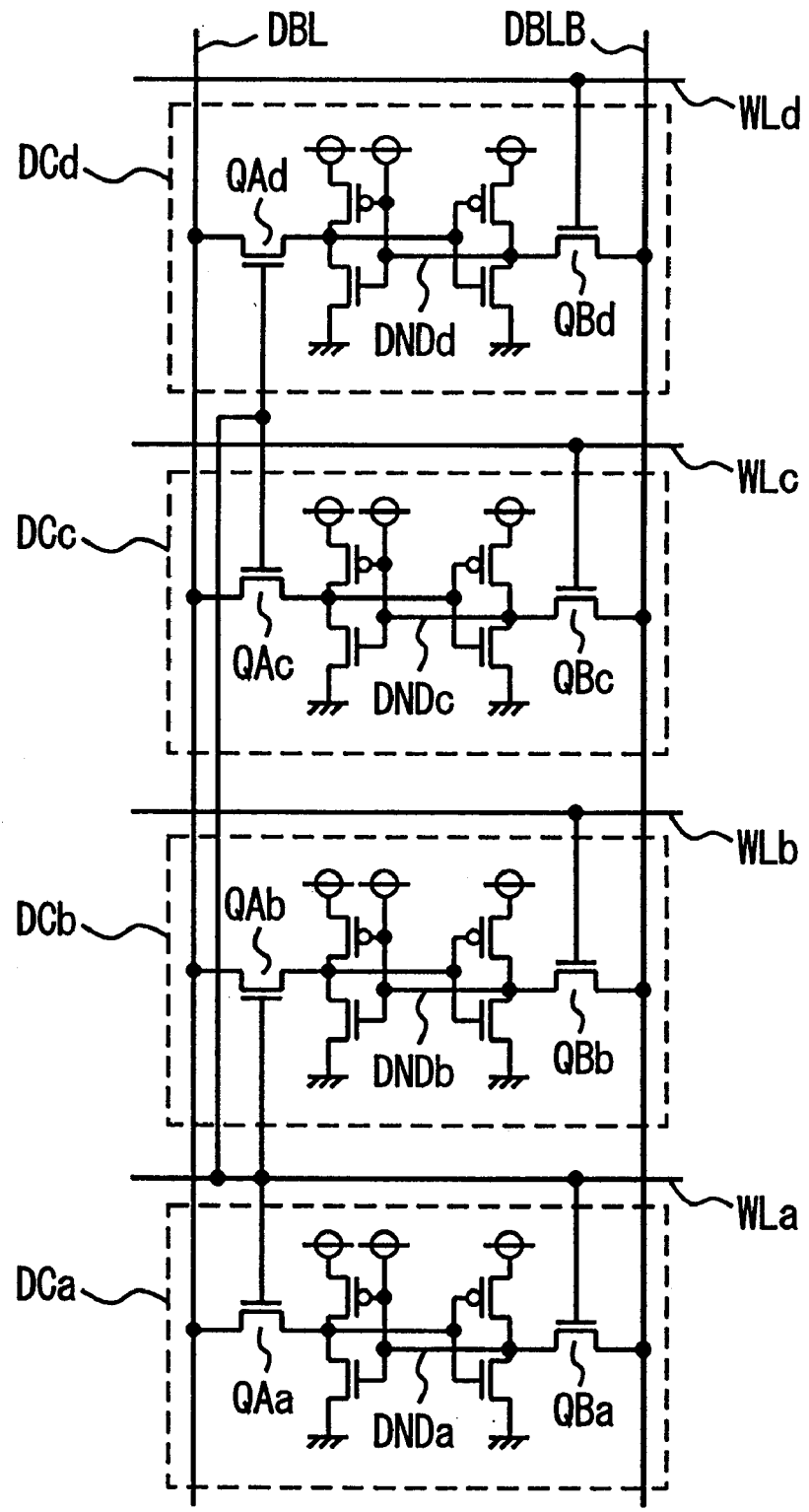
FIG. 16 shows an arrangement of dummy cells in a semiconductor memory device according to a fourth embodiment of the invention.

FIG. 16 shows an arrangement of dummy cells in a semiconductor memory device according to a fourth embodiment of the invention. FIG. 16 representatively shows dummy cells DCa–DCd arranged in four rows and one column. Word lines WLa–WLd are arranged corresponding to dummy cells DCa–DCd, respectively. Access transistors QAa–QAd of dummy cells DCa–DCd have gates commonly connected to word line WLa. Dummy cells DCa–DCd are configured to have the internal nodes DNDa–DNDd fixed to the power supply voltage level so as to transmit data at L level to dummy bit line DBL when selected.

Other access transistors QBa–QBd of dummy cells DCa–DCd have gates coupled to corresponding word lines WLa–WLd, respectively, and provide the data at H level to complementary dummy bit line DBLB when selected.

The electric circuit structure of each of dummy cells DCa–DCd is the same as that of the first embodiment.

In the structure shown in FIG. 16, when word line WLa is selected, access transistors QAa–QAd of four dummy cells DCa–DCd are simultaneously rendered conductive, and dummy cells DCa–DCd of four bits discharge dummy bit line DBL. Therefore, the voltage on dummy bit line DBL can be lowered much faster, and the read signal can be activated at a fast timing. Complementary dummy bit line DBLB maintains H level.

Figure 17:
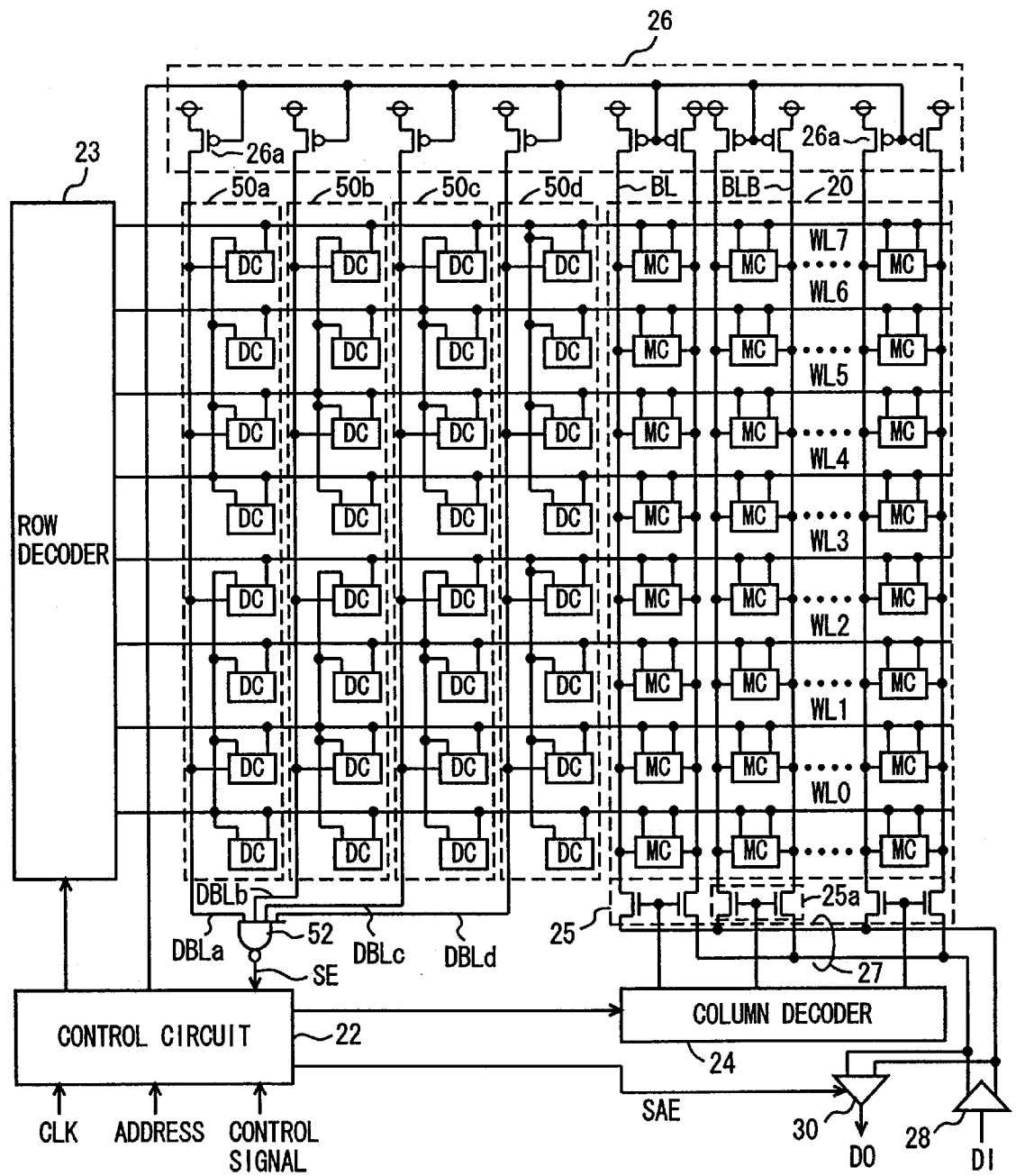
FIG. 17 schematically shows a whole structure of the semiconductor memory device according to the fourth embodiment of the invention.

FIG. 17 schematically shows a whole structure of the semiconductor memory device according to the fourth embodiment of the invention. The structure in FIG. 17 includes dummy cell columns 50a–50d each including dummy cells DC aligned in the column direction, and normal memory cell array 20 including normal memory cells MC arranged in rows and columns. Dummy cells DC and normal memory cells MC are arranged in alignment in the row direction. Word lines WL are arranged corresponding to the respective rows of dummy cells DC and normal memory cells MC. FIG. 17 representatively shows eight word lines WL0–WL7.

Dummy bit lines DBLa–DBLd are arranged corresponding to dummy cell columns 50a–50d, respectively. In dummy cell column 50a, dummy cells DC of four bits are simultaneously selected to discharge dummy bit line DBLa when word line WL0 or WL4 is selected. In dummy cell column 50b, dummy cells DC of four bits are simultaneously selected to discharge dummy bit line DBLb when word line WL1 or WL5 is selected. In dummy cell column 50c, dummy cells DC of four bits are simultaneously selected to discharge dummy bit line DBLc when word line WL2 or WL6 is selected. In dummy cell column 50d, dummy cells DC of four bits are simultaneously selected to discharge dummy bit line DBLd when word line WL3 or WL7 is selected.

A voltage detecting circuit 52 is provided to these dummy bit lines DBLa–DBLd. Voltage detecting circuit 52 raises read signal SE to H level when the voltage level of any one of dummy bit lines DBLa–DBLd lowers below its input logical threshold voltage.

Precharge circuit 26 is provided for precharging dummy bit lines DBLa–DBLd and normal bit lines BL and BLB of normal memory cell array 20 to the power supply voltage level in a standby state. The structures of the peripheral circuits shown in FIG. 17 are the same as the peripheral circuits of the semiconductor memory device shown in FIG. 9. Corresponding portions are allotted with the same reference numerals, and description thereof is not repeated.

In the structures shown in FIGS. 16 and 17, the operation in data reading of control circuit 22 is the same as that of control circuit 22 in the first embodiment. When word line WL is selected, the data of normal memory cell MC connected to word line WL is read onto corresponding normal bit lines BL and BLB. In this operation, precharge circuit 26 stops the precharging operation.

Dummy cell DC is driven to the selected state at the same timing as the driving of normal bit lines BL and BLB by normal memory cells MC so that one of dummy bit lines DBLa–DBLd is discharged. Normal bit line BL or BLB is discharged by normal memory cell MC of one bit, and one of dummy bit lines DBLa–DBLd is discharged by dummy cells DC of four bits. Therefore, the voltage lowering speed of dummy bit lines DBLa–DBLd is higher than that of normal bit line BL or BLB, and voltage detecting circuit 52 can raise read signal SE at a fast timing.

Therefore, read signal SE can be raised with a sufficient margin with respect to the activation timing of sense amplifier activating signal SAE for sense amplifier 30, and the activation timing of sense amplifier 30 can be optimized more easily.

Likewise, for driving the selected word line to the deselected state in response to activation of read signal SE, the deactivation timing of the selected word line can be optimized, and the discharging time of normal bit lines BL and BLB can be reduced so that the power consumption can be reduced. By reducing the amounts of voltage lowering of normal bit lines BL and BLB, the voltage recovery of the normal bit line can be performed apidly when precharge circuit 26 is made active.

Since dummy bit lines DBLa–DBLd are driven by dummy cells DC of four bits, even if the transistor characteristics are varied over dummy cell transistors of four bits, such variation can be averaged to reduce the degree of the variation by simultaneous selection of the dummy cells DC of four bits. Accordingly, it is possible to reduce the influence due to variation of dummy cell transistor characteristics exerted on the rising timing of read signal SE, and the operation margin can be improved.

Fifth Embodiment

Figure 18:
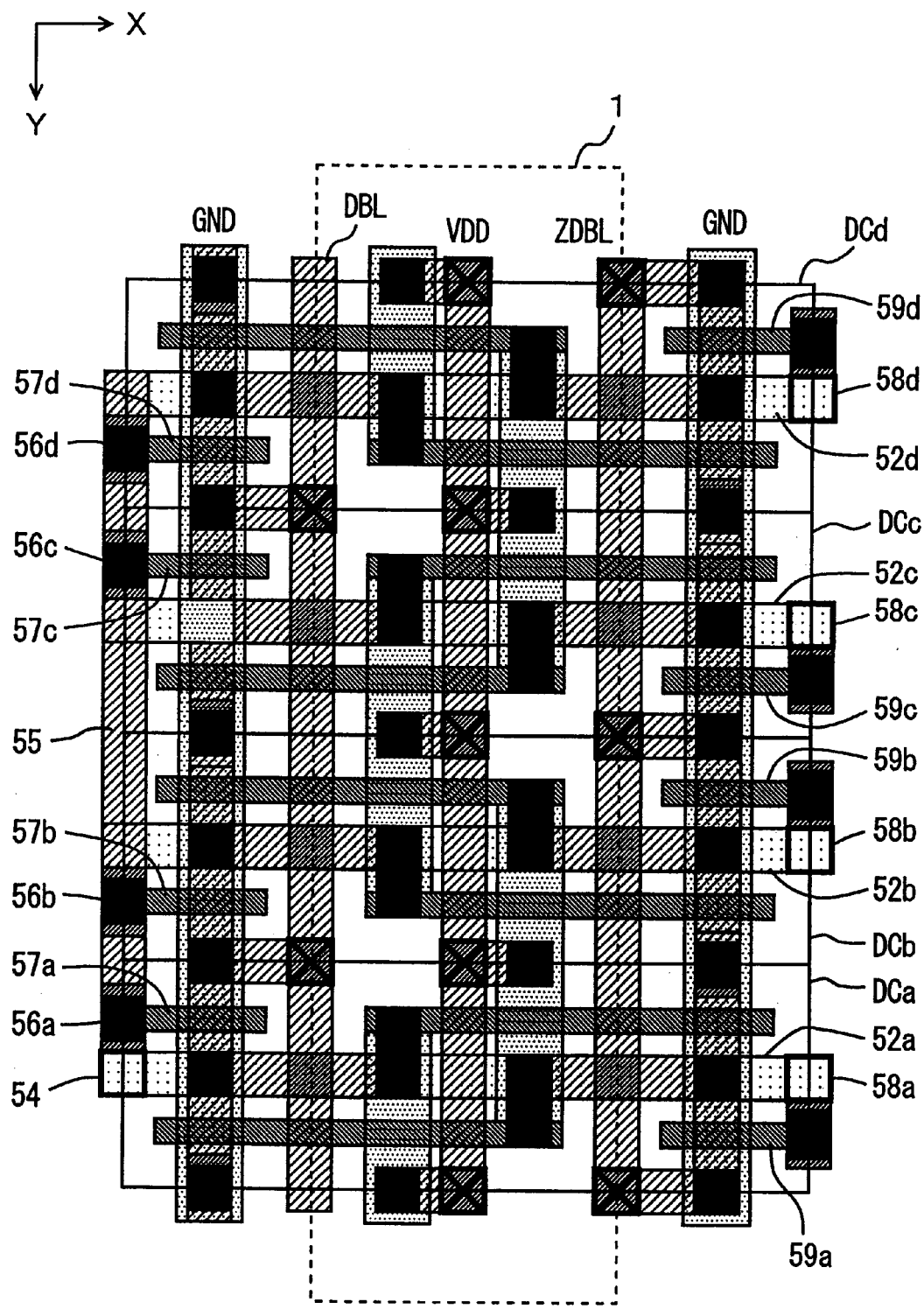
FIG. 18 shows a layout of dummy cells according to a fifth embodiment of the invention.

FIG. 18 schematically shows a layout of the dummy cells of four bits according to a fifth embodiment of the invention. The layout of dummy cells DCa–DCd shown in FIG. 18 are substantially the same as the layout of the dummy cells of two bits shown in FIG. 6. Third metal interconnections 58a–58d extending in the X direction are arranged corresponding to dummy cells DCa–DCd, respectively. Third metal interconnection 52a is connected to a second metal interconnection 55 extending in the X direction through a second via hole 54.

Second metal interconnection 55 is connected to first polycrystalline silicon interconnections 57a–57d extending in the Y direction through contact holes 56a–56d, respectively. First polycrystalline silicon interconnections 57a–57d constitute gates of access transistors connected to dummy bit line DBL.

The via hole is not formed at crossing portions of second metal interconnection 55 to third metal interconnections 58b–58d. Therefore, the access transistors of dummy cells DCa–DCd connected to dummy bit line DBL are turned on in accordance with the word line select signal transmitted onto third metal interconnection 58a.

The other ends of third metal interconnections 52a–52d are connected through second via holes 58a–58d and contact holes to first polycrystalline silicon interconnections 59a–59d, respectively. These first polycrystalline silicon interconnections 59a–59d form the access transistors connected to complementary dummy bit line DBLB. Therefore, the access transistors connected to complementary dummy bit line ZDBL are individually turned on in accordance with the word line select signals transmitted onto third metal interconnections 58a–58d, respectively.

The layout of each of dummy cells DCa–DCd shown in FIG. 18 is the same as that of the normal memory cell shown in FIG. 2. Therefore, the dummy cells connected to the dummy bit line are equal in number to the normal bit lines connected to the normal bit line, and the load of the dummy bit line DBL can be equal to the load of normal bit line BL or ZBLB. Thereby, the voltage changing speed of the dummy bit line can be made faster than that of the normal bit line. Further, the voltage lowering speed of dummy bit line DBL with respect to the voltage lowering speed of normal bit lines BL and ZBL can be easily estimated, and therefore the rising timing of read signal SE can be estimated so that the timing of activation of the sense amplifier and driving a selected the word line to a deselected state according to read signal SE can be easily adjusted.

Figure 19:
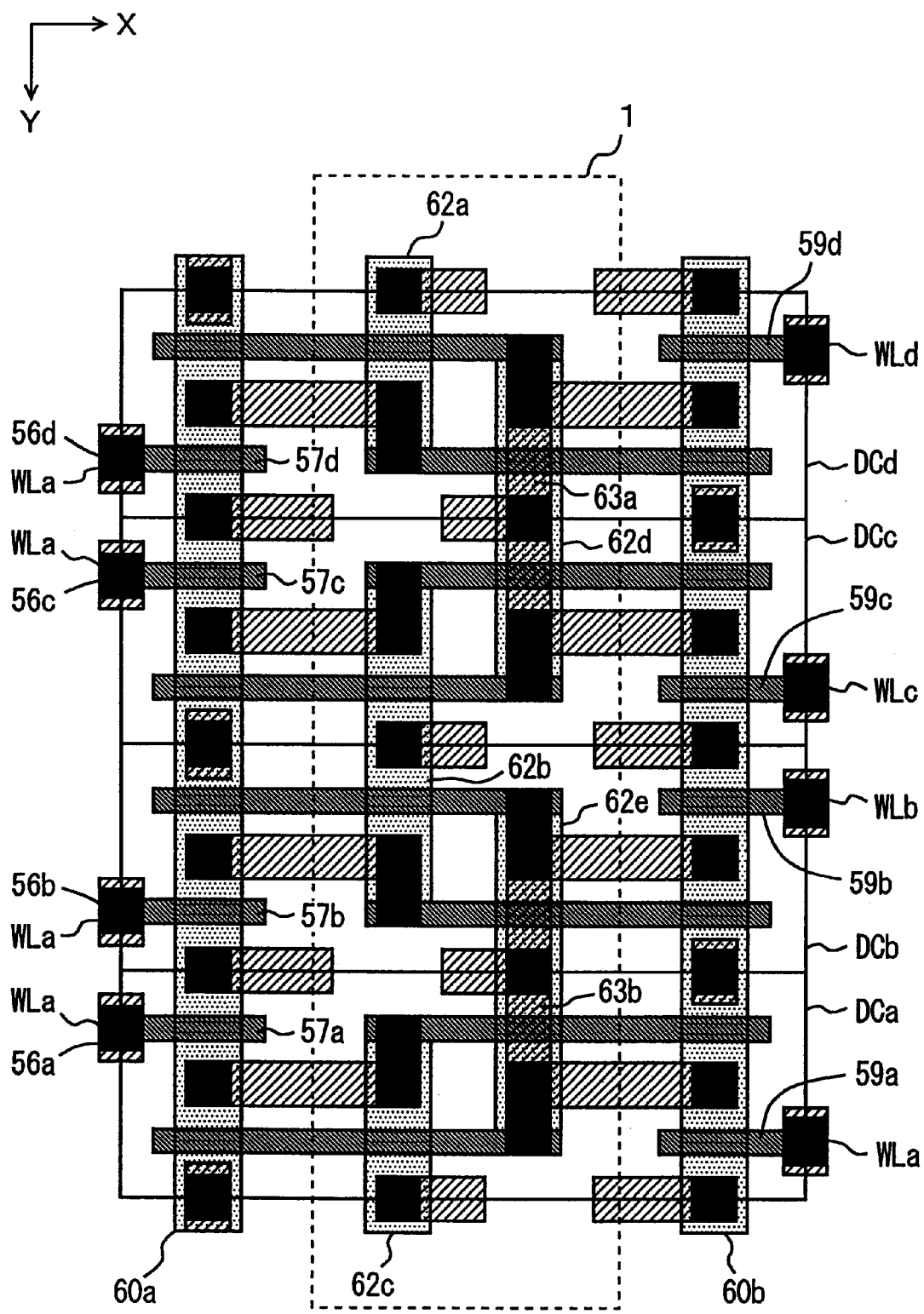
FIG. 19 is a layout of a lower layer interconnection in the layout shown in FIG. 18.

FIG. 19 shows a layout of portions up to the first metal interconnections in the layout shown in FIG. 18. As shown in FIG. 19, dummy cells DCa–DCd have connecting portions 56a–56d for connecting to first polycrystalline silicon interconnections 57a–57d constituting the word lines, respectively. These connecting portions 56a–56d are connected to second metal interconnections through upper layer via holes.

First polycrystalline silicon interconnections 59a–59d are connected to third metal interconnection 52a–52d shown in FIG. 18 through connecting portions, and are connected to word lines WLa–WLd, respectively.

In these dummy cells DCa–DCd, in order to fix the internal storage nodes to the power supply voltage, first metal interconnections 63a and 63b are formed parallel to active regions 62d and 62e, respectively, and are connected to the power supply line through the first metal interconnections and the first via holes, and supply the power supply voltage to the gates of load transistors and driver transistors arranged for the storage nodes storing the L-level data.

In N-well region 1, active regions 62a–62e are formed for forming P-channel MOS transistors. These active regions 62a–62e are each shared by the dummy cells adjacent to each other in the column direction. For forming the access transistor and driver transistor, active regions 60a and 60b extending in the Y direction are formed.

The layout up to the first metal interconnections shown in FIG. 19 is substantially the same as that of the normal memory cells previously described with reference to FIG. 3. Therefore, the gates and active regions of the load transistors, driver transistors and access transistors can have the same configurations as those in the normal memory cells so that the dummy cells can have the same transistor characteristics as the normal memory cells. Accordingly, even if variations occur in manufacturing parameters of the transistors such as a threshold voltage and a ratio of a channel width to a channel length, transistor characteristics can be varied in the same direction between the normal memory cells and the dummy cells, and the margin for the variations in manufacturing parameters can be increased.

Figure 20:
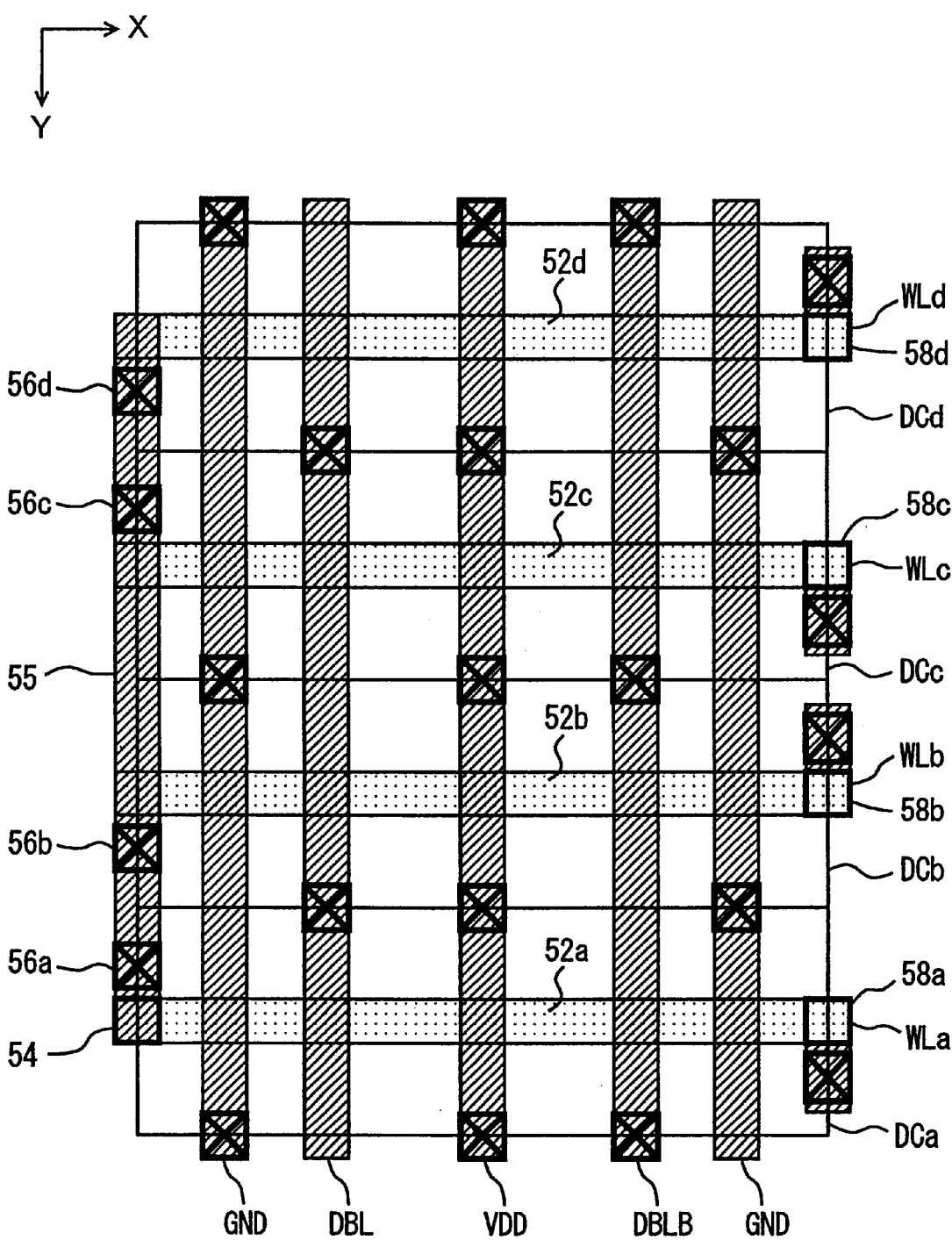
FIG. 20 shows a layout of an upper layer interconnection in the layout shown in FIG. 18.

FIG. 20 shows a layout of the portions from the first via holes up to the third interconnections shown in FIG. 18. As shown in FIG. 20, third metal interconnections 52a–52d extending in the X direction are arranged corresponding to dummy cells DCa–DCd, respectively. Second metal interconnection 55 extending in the Y direction makes crossings with third metal interconnections 52a–52d. Second metal interconnection 55 is electrically connected to first polycrystalline silicon interconnections 57a–57d shown in FIG. 19 through first via holes formed at connecting portions 56a–56d, respectively. The second via hole is not formed at crossing portions of second metal interconnection 55 to third metal interconnections 52b–52d. Second metal interconnection 55 is connected to third metal interconnection 52a through second via hole 54.

Third metal interconnections 52a–52d are connected through second via holes 58a–58d to first polycrystalline silicon interconnections 59a–59d (see FIGS. 18 and 19), which constitute gates of access transistors connected to the complementary dummy bit line of dummy cells DCa–DCd, respectively.

Therefore, the layout shown in FIG. 20 differs from the layout already described with reference to FIG. 8 in that second metal interconnection 55 is arranged commonly to dummy cells DCa–DCd of four bits, which are connected through connecting portions 56a–56d to the gates of access transistors connected to dummy bit line DBL. Therefore, the arrangement for simultaneously select the dummy cells of four bits can be implemented by arranging the dummy cells in the same layout as the normal memory cells with the positions of via holes changed.

In FIG. 20, the second metal interconnections extending in the Y direction in FIG. 20 constitute a ground line transmitting the ground voltage, dummy bit line DBL, power supply line transmitting power supply voltage VDD, complementary dummy bit line DBLB and ground line transmitting ground voltage GND, respectively.

In the layout of the dummy cells shown in FIGS. 18–20, the dummy cells adjacent in the X direction have a layout mirror symmetric with the layout shown in FIG. 20. If the via holes and contact holes are shared by the dummy cells adjacent in the X direction, the following layout may be utilized. Specifically, in the layout shown in FIG. 20, second via hole 58b for word line WLb is employed for connecting a second metal interconnection commonly to the dummy cells of four bits. In this case, when word line WLb is selected, the dummy cells of four bits are simultaneously connected to the complementary dummy bit line DBLB. However, this causes no practical problem because dummy bit line DBLB is not used for the voltage detection. Thereby, the dummy cells can be arranged in four columns at a high density without arranging a redundant cell column.

According to the fifth embodiment of the invention, as described above, the dummy cells are configured into the same layout as the normal memory cells, and the layout of the second metal interconnections and the positions of the second via holes are merely changed for connecting the dummy cells of four bits to a common word line. Thereby, the normal memory cells and the dummy cells can be readily made the same in transistor characteristics, which facilitates the designing of timing.

Sixth Embodiment

Figure 21:
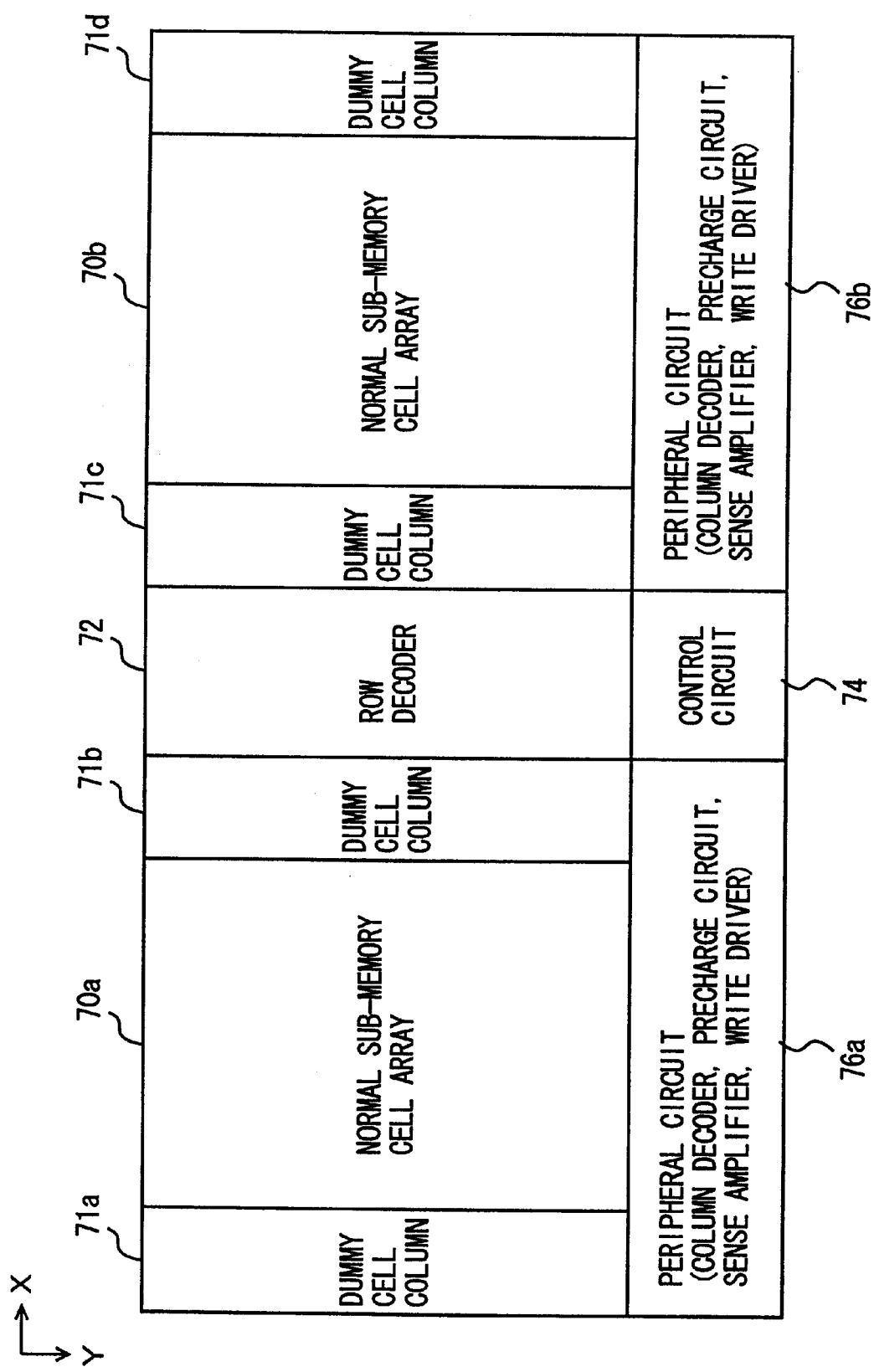
FIG. 21 schematically shows a whole structure of a semiconductor memory device according to a sixth embodiment of the invention.

FIG. 21 schematically shows a whole structure of the semiconductor memory device according to a sixth embodiment of the invention. In FIG. 21, the semiconductor memory device includes normal sub-memory cell arrays 70a and 70b each having normal memory cells arranged in rows and columns, and a row decoder 72 arranged between normal sub-memory cell arrays 70a and 70b. Row decoder 72 may simultaneously drive the word lines to the selected state in normal sub-memory cell arrays 70a and 70. In such arrangement, the dummy cells of four bits are simultaneously selected in dummy cell columns 71a–71d, respectively.

Alternatively, row decoder 72 may be configured to select the word line in one of normal sub-memory cell arrays 70a and 70b in accordance with an array select signal. Thus, the array select signal is applied to a word line drive circuit for driving the word line, and only the word line drive circuit provided for the selected normal sub-memory cell array is activated. In this case, a row decode circuit for decoding the row address signal is provided commonly to normal sub-memory cell arrays 70a and 70b, and performs the decoding operation. In this structure, the dummy cells of two bits are simultaneously selected in dummy cell columns 71a–71d when the corresponding word line is selected.

Dummy cell columns 71a and 71b are arranged on the opposite sides in the X direction of normal sub-memory cell array 70a, respectively. Dummy cell columns 71c and 71d are arranged on the opposite sides in the X direction of normal sub-memory cell array 70b, respectively. These dummy cell columns 71a–71d correspond to dummy cell columns 50a–50d shown in FIG. 17.

For normal sub-memory cell array 70a, a peripheral circuit 76a is arranged. A peripheral circuit 76b is arranged for normal sub-memory cell array 70b. Each of peripheral circuits 76a and 76b includes a column decoder, a precharge circuit, a sense amplifier and a write driver. A control circuit 74 is arranged between these peripheral circuits 76a and 76b. Peripheral circuits 76a and 76b may be selectively activated in accordance with the array select signal, or may be simultaneously controlled to enter the active or inactive state.

For producing the read signal, if the activation and deactivation are performed on a memory array basis, the timing of activation of the sense amplifier as well as the deactivation timing of the word line and the activation timing of the precharge circuit in peripheral circuit 76a are determined in accordance with the voltages on the dummy bit lines arranged corresponding to dummy cell columns 71a and 71b. Likewise, the timing of activation of the sense amplifier as well as the deactivation timing of the word line and the activation timing of the precharge circuit in peripheral circuit 76b are determined in accordance with the voltages on the dummy bit lines arranged corresponding to dummy cell columns 71c and 71d. In this case, when the corresponding word line is selected in each dummy cell column, the dummy cells of two bits are driven to the selected state. In the above structure, therefore, control circuit 74 executes activation and deactivation of one of peripheral circuits 76a and 76b in accordance with the array select signal.

Alternatively, the word lines may be selected simultaneously in normal sub-memory cell arrays 70a and 70b. In this case, peripheral circuits 76a and 76b are activated simultaneously. Activation of the read signal is performed by detecting the voltages of dummy cell columns 71a–71d. In this case, the dummy cells of four bits are driven to the selected state in each dummy cell column when the corresponding word line is selected.

The dummy cells arranged in dummy cells 71a–71d have the layout shown in FIGS. 6–8 or FIGS. 18–20.

As described above, the portion for arranging second metal interconnection 15s or 55 for simultaneously selecting multiple bits is located in an end portion remote from the normal sub-memory cell array. Thereby, the dummy cells and the normal memory cells can be arranged in the same layout in normal sub-memory cell array 70a and dummy cells 71a and 71b. This holds also with respect to normal sub-memory cell array 70b and dummy cell columns 71c and 71d. Accordingly, there is no need to provide the redundant cells for the second metal interconnection (15s or 55) for simultaneously selecting the multiple bits in the normal memory cell column, and increase in area of normal sub-memory cell arrays 70a and 70b can be suppressed.

Seventh Embodiment

Figure 22:
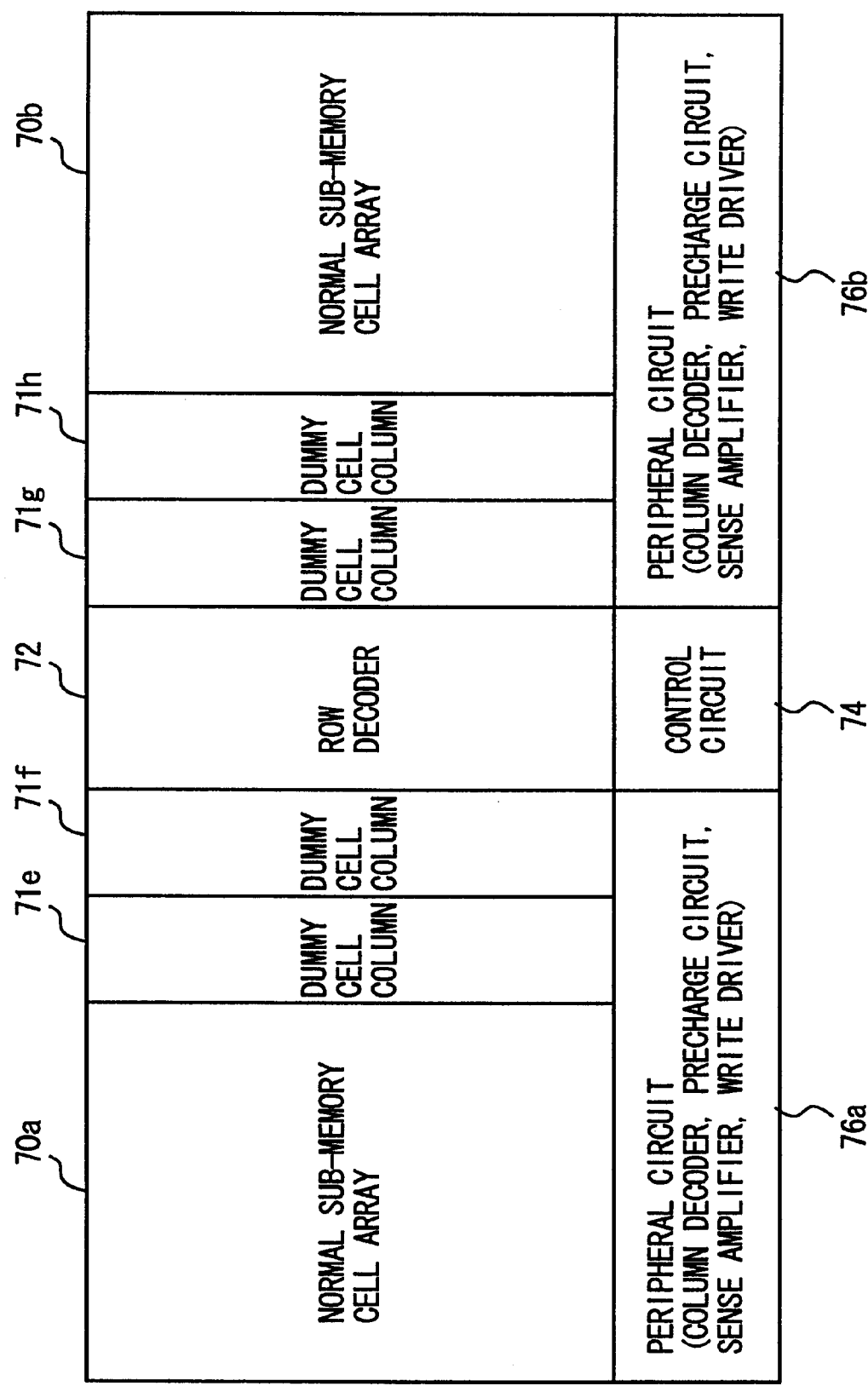
FIG. 22 schematically shows a whole structure of a semiconductor memory device according to a seventh embodiment of the invention.

FIG. 22 schematically shows a whole structure of a semiconductor memory device according to a seventh embodiment of the invention. According to the structure shown in FIG. 22, dummy cell columns 71e and 71f are arranged at a side of normal sub-memory cell array 70a near row decoder 72. Dummy cell columns 71g and 71h are arranged between normal sub-memory cell array 70b and row decoder 72. Structures other than the above are the same as those shown in FIG. 21. Corresponding portions are allotted with the same reference numerals, and description thereof is not repeated.

Row decoder 72 transmits a word line drive signal to normal submemory cell arrays 70a and 70d. The word line has an interconnection resistance, and causes a delay in signal propagation. Dummy cell columns 71e–71h are arranged adjacent to row decoder 72, whereby dummy cell columns 71e–71h can be discharged at a fast timing without an influence by the propagation delay of the word line drive signal.

Figure 23:
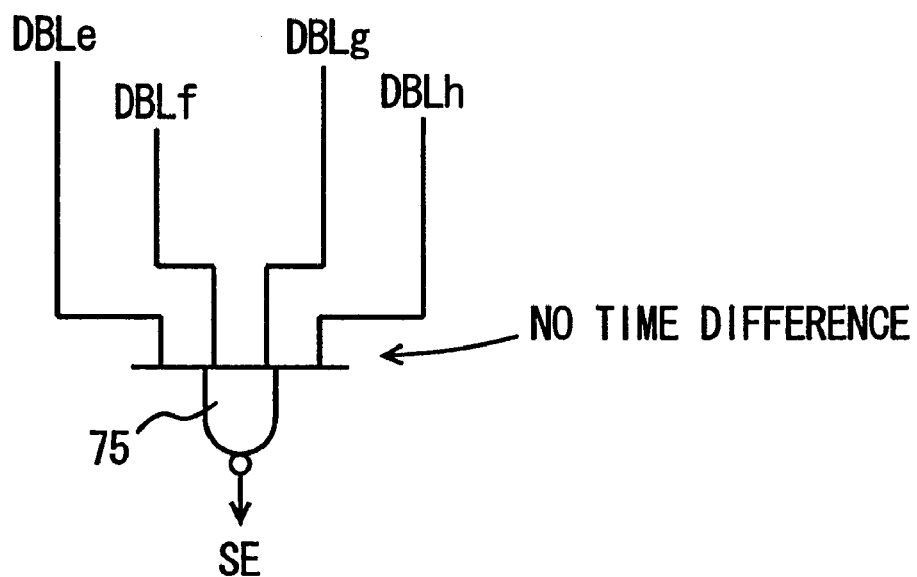
FIG. 23 schematically shows a structure of a voltage detecting portion of the semiconductor memory device shown in FIG. 22.

In FIG. 23, a voltage detecting circuit 75 is coupled to dummy bit lines DBLe–DBLh arranged corresponding to dummy cell columns 71e 71h, respectively. In this structure, there is caused no timing difference in time point when the voltage levels of dummy bit lines DBLe–DBLh can lower to or below the input logical threshold of voltage detecting circuit 75, and read signal SE can be raised at substantially the same timing in accordance with the voltage levels of dummy bit lines DBLe–DBLh. It is not necessary to consider the timing margin for the rising of read signal SE so that a sufficient margin can be ensured for activation timing of the sense amplifier activating signal, and activation timing of the sense amplifier can be optimized.

Voltage detecting circuit 75 shown in FIG. 23 is commonly connected to dummy bit lines DBLe–DBLh arranged corresponding to dummy cell columns 71e–71h, respectively. In dummy cell columns 71e and 71f, dummy bit lines DBLe and DBLf are discharged when word lines WL0 and WL2 are selected, respectively. In dummy cell columns 71g and 71h, dummy bit lines DBLg and DBLh are discharged when word lines WL1 and WL3 are selected, respectively. In the structure shown in FIG. 22, therefore, word lines are simultaneously driven to the selected state in both normal sub-memory cell arrays 70a and 70b. In accordance with the memory cell array select signal, one of peripheral circuits 76a and 76b is activated.

The structure shown in FIG. 22 may be configured such that one of memory arrays 70a and 70b is selected in accordance with the array select signal. In this case, a voltage detecting circuit is arranged for each of peripheral circuits 76a and 76b for activating the corresponding sense amplifier.

According to a seventh embodiment of the invention, as described above, the normal memory cell arrays are arranged on the opposite sides of the row decoder, respectively, and the two dummy cell columns are arranged on the side of each normal memory cell array near the row decoder. Thereby, the read signal can be activated at an accurate timing to activate the sense amplifier and to drive the word line to the deselected state.

Eighth Embodiment

Figure 24:
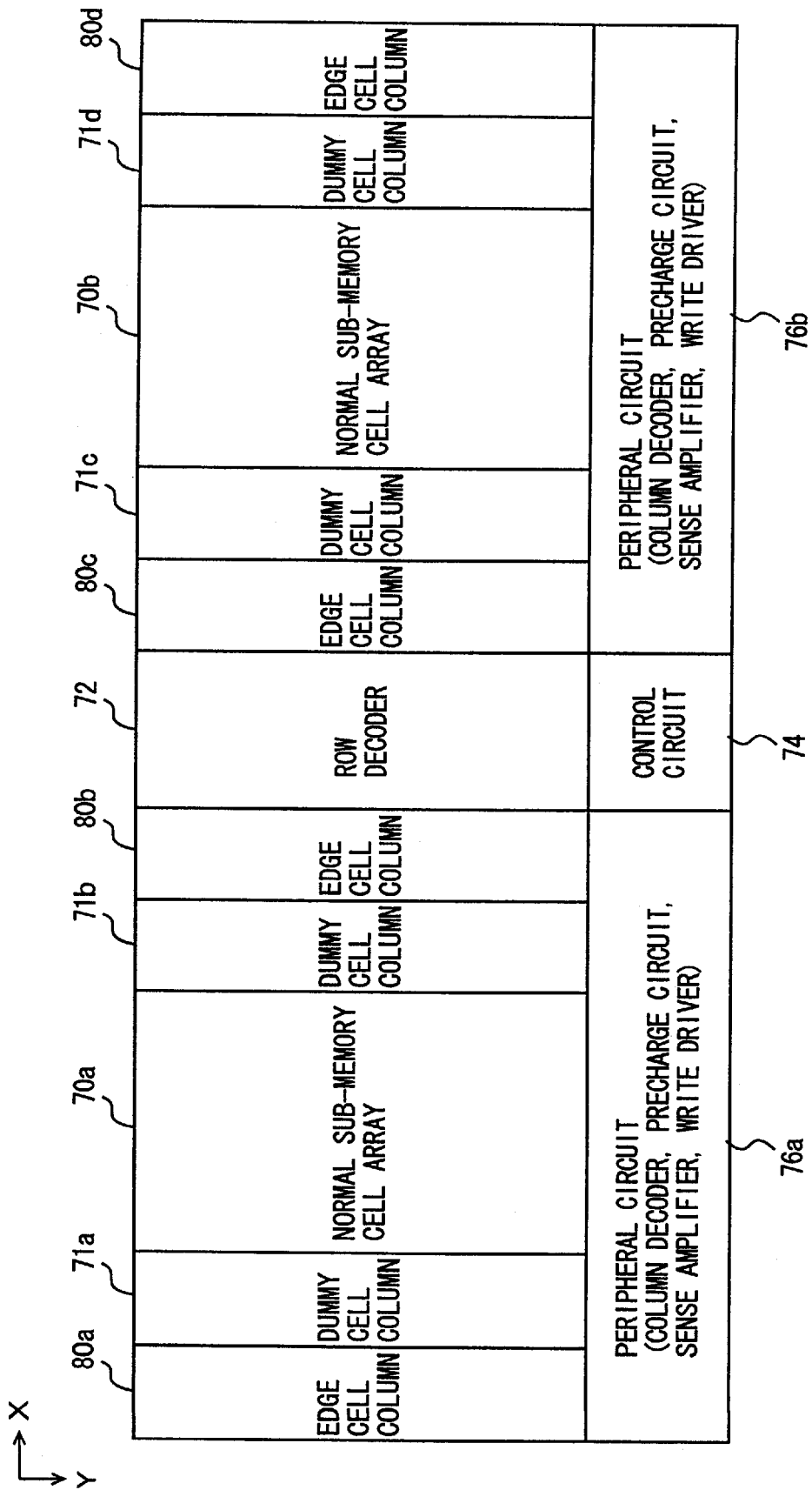
FIG. 24 schematically shows a whole structure of a semiconductor memory device according to an eighth embodiment of the invention.

FIG. 24 schematically shows a whole structure of a semiconductor memory device according to an eighth embodiment of the invention. In FIG. 24, dummy cell columns 71a and 71b are arranged on the opposite sides in the X direction of the normal sub-memory cell array. Edge cell columns 80a and 80b adjacent to dummy cell columns 71a and 71b, respectively. Edge cell column 80a is arranged outside dummy cell column 71a. Edge cell column 80b is arranged between dummy cell column 71b and row decoder 72.

On the opposite sides in the X direction of normal sub-memory cell array 70b, dummy cell columns 71c and 71d are arranged, respectively. An edge column 80c is arranged between row decoder 72 and dummy cell column 71c. An edge cell column 80d is arranged outside dummy cell column 71d. Other circuits, i.e., peripheral circuits 76a and 76b as well as calculating circuit 74 are arranged similarly to the those previously described and shown in FIG. 21.

For preventing deviation of the patterns of the normal memory cells, edge cell columns 80a–80d are arranged at the ends of the arrays. These edge cell columns 80a–80d include feature dummy cells (edge cells) having the same layout patterns as the memory cells. The edge cells included in edge cell columns 80a–80d are not used for data storage, and are used merely for maintaining the regularity of the layout patterns of memory cells.

As miniaturization of elements progresses, it becomes difficult to control the pattern final feature sizes in a patterning process due to irregular reflection of exposure light at a stepped portion as well as influences by neighboring layout patterns. In recent years, therefore, such measure is generally employed that size correction is carried out taking into consideration the influences by the neighboring layout patterns in printing an intended layout feature on the mask. However, it is difficult to effect such correction on a boundary between the extremely miniaturized pattern such as the memory cells and its peripheral pattern because these patterns are quite different in regularity.

Accordingly, the mere feature dummy cell (edge cell), which is not used as the usual memory cell for data storage, is arranged at the end of the memory cell array, where the final feature size may deviate from an intended feature, to maintain the pattern regularity for the memory array of the memory cells for data storage, for preventing the final feature size of memory cells for data storage from deviating from the intended feature.

In this eighth embodiment, dummy cell columns 71a–71d are arranged adjacently to edge cell columns 80a–80d, respectively. Edge cells arranged in edge cell columns 80a–80d are not used for the data storage. The edge cells in edge cell columns 80a–80d and the dummy cells in dummy cell columns 71a–71d are patterned to the same layout. Therefore, in the structure where the access transistors of a plurality of dummy cells are connected to the same word line, the dummy access transistors of the plurality of edge cells in the corresponding edge cell column are connected to the same word line. The normal memory cell columns are arranged adjacent to dummy cell columns 71a–71d, respectively. In this case, each of dummy cell columns 71a–71d is arranged symmetrically in layout to the corresponding normal memory cells in normal sub-memory cell arrays 70a and 70b. Thereby, in normal sub-memory cell arrays 70a and 70b, the normal memory cells can be arranged corresponding to each word line without an influence by the layout of the dummy cells.

Thereby, it is not necessary to arrange a redundant cell column for eliminating the irregularity in dummy cell columns 71a–71d, and the increase in area of the memory cell array can be suppressed.

Figure 25:
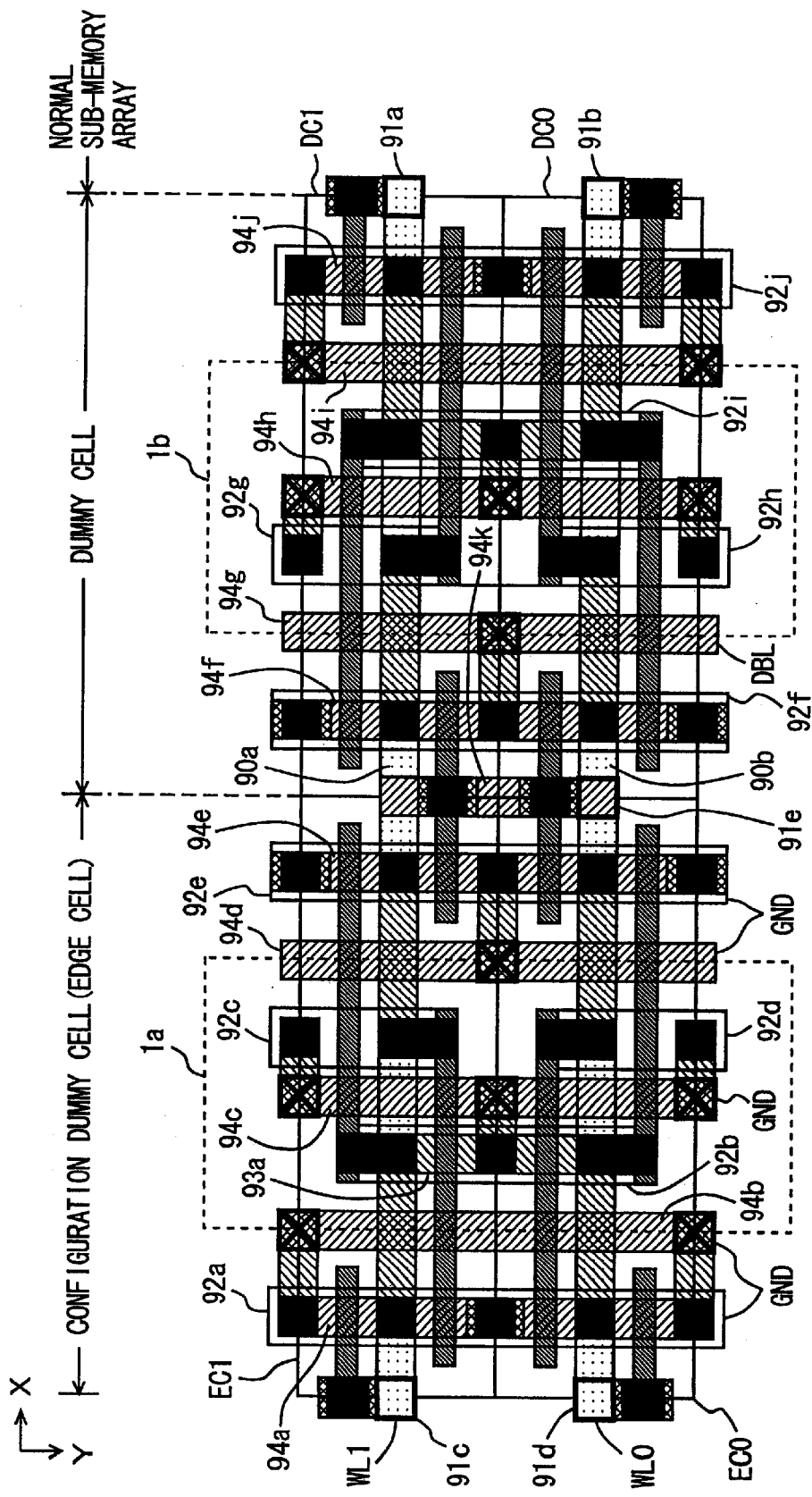
FIG. 25 schematically shows a layout of a main portion of the semiconductor memory device according to the eighth embodiment of the invention.

FIG. 25 schematically shows a layout of the edge cells and dummy cells. FIG. 25 representatively shows dummy cells DC0 and DC1 and edge cells EC0 and EC1. Normal memory cells of the normal sub-memory cell array are arranged in the right side region with respect to dummy cells DC0 and DC1. The row decoder shown in FIG. 24 is arranged on the left side of edge cells EC0 and EC1. Alternatively, the peripheral circuit placed outside the memory cell array is placed outside edge cells EC0 and EC1.

Active regions 92a and 92e extending in the Y direction are arranged in a region outside an N-well 1a. Active regions 92f and 92j are formed outside an N-well 1b. N-channel MOS transistors are formed in these active regions.

In N-well 1a, active regions 92b, 92c and 92d each having a rectangular form extending in the Y direction are formed. In N-well 1b, active regions 92g, 92h and 92i each having a rectangular form extending in the Y direction are formed.

A second metal interconnection 94a extending in the Y direction is arranged parallel to active region 92a. A first metal interconnection 93a is formed parallel to active region 92b. Metal interconnection 93a is connected through a via hole to a second metal interconnection 94c, which in turn is coupled to source regions of active regions 92c and 92d.

A second metal interconnection 94e is arranged parallel to active region 92e. Each of second metal interconnections 94a–94e transmits ground voltage GND. Therefore, all the internal nodes in edge cells EC0 and EC1 attain the ground voltage level.

A third metal interconnection 90a extending in the X direction is arranged commonly to edge cell EC1 and dummy cell DC1, and a third metal interconnection 90b extending in the X direction is formed commonly to edge cell EC0 and dummy cell DC0. Third metal interconnection 90a is connected to the gate of access transistor of edge cell EC1 through a via hole 91c. Third metal interconnection 90b is connected to the gate of access transistor of edge cell EC0 through a via hole 91d and a contact hole.

Third metal interconnection 90b is connected to a second metal interconnection 94k through a via hole 91e. Second metal interconnection 94k is connected to gates of the other access transistor in each of edge cells EC0 and EC1 through contact holes. In edge cells EC0 and EC1, therefore, the access transistors arranged at the boundary to the dummy cells are commonly connected to word line WL0. If four bits of dummy cells are connected to word line WL0, second metal interconnection 94k placed in the boundary region between the edge cells and the dummy cells is arranged continuously over the memory cells of four bits.

The dummy cell has a mirror symmetric layout in the X direction to the edge cell, and a second metal interconnection 94f formed parallel to active region 92f transmits a ground voltage. The access transistor formed in active region 92f is connected to second metal interconnection 94g through a contact hole and a first via hole.

Third metal interconnection 90a is connected to a gate of the other access transistor of dummy cell DC1 through a second via hole 91a. Third metal interconnection 90b is connected to a gate of the other access transistor of dummy cell DC0 through a second via hole 91b.

A second metal interconnection 94j is formed parallel to active region 92j. Second metal interconnection 94j transmits a ground voltage, and is coupled to a source region of the driver transistor through a contact hole formed in a central region of active region 92j.

Second metal interconnection 94i is arranged parallel to second metal interconnection 94j. Second metal interconnection 94i is connected to the access transistor formed in active region 92j through a first metal interconnection and a first via hole. The second metal interconnection forms a complementary dummy bit line.

Although not shown, normal memory cells are formed adjacently to dummy cells DC0 and DC1. These normal memory cells have the mirror symmetric in X direction to the layouts of the dummy cells. In the boundary regions between the dummy cells and the normal memory cells, therefore, the access transistors of dummy cells DC0 and DC1 are connected at their gates to third metal interconnections 90b and 90a forming word lines WL1 and WL0, respectively. Therefore, the normal memory cells are likewise selected individually by word lines WL0 and WL1 corresponding to third metal interconnections 90b and 90a, respectively.

Therefore, the normal memory cells can be arranged without an influence of the layout of the dummy cells. Since the edge cells are arranged, the dummy cells can be formed by repeating a regular pattern similarly to the normal memory cells so that deviation of the patterns can be suppressed. Owing to these edge cells, the dummy cells and the normal memory cells can have substantially uniform transistor characteristics with each other.

Figure 26:
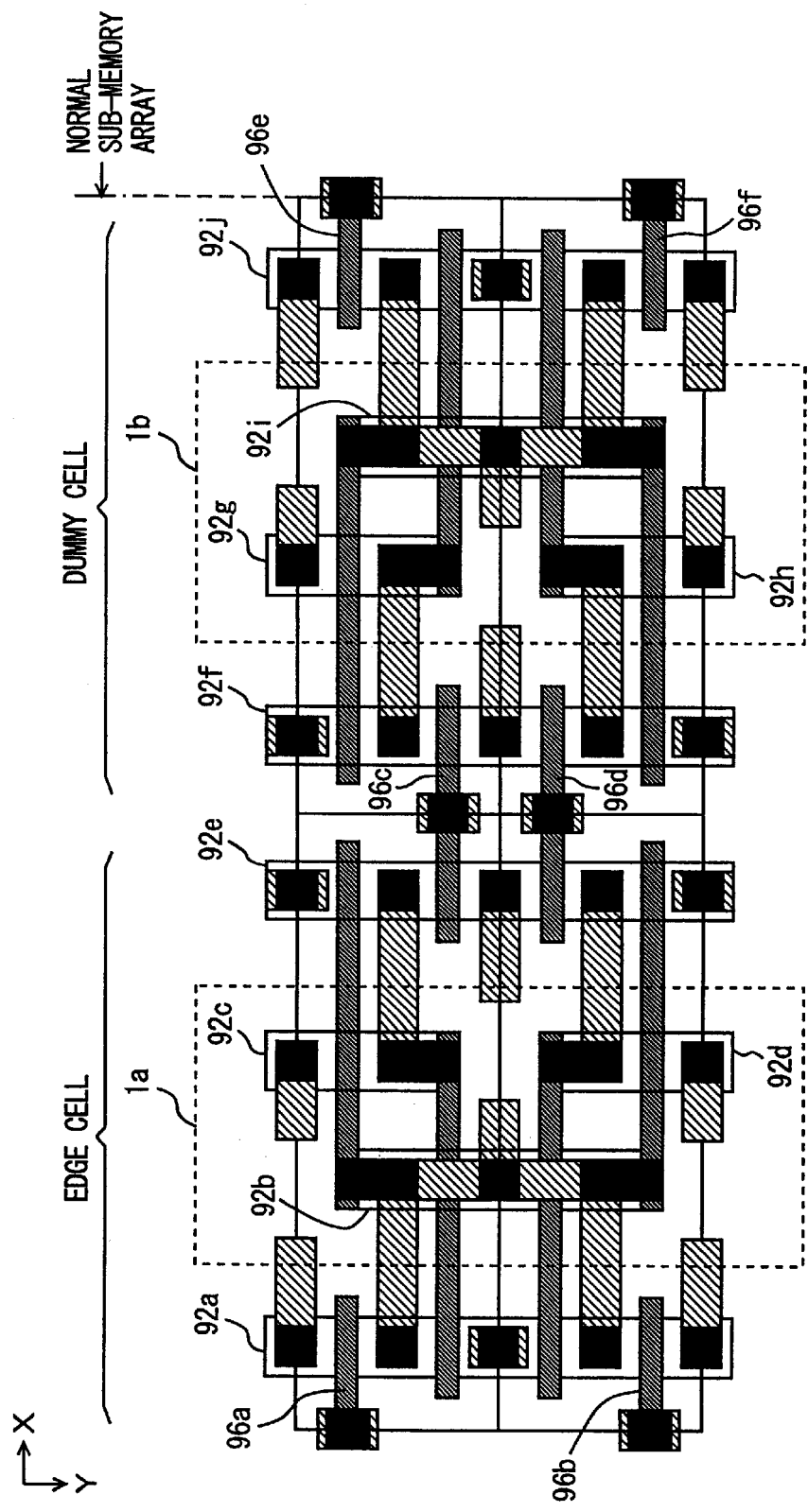
FIG. 26 shows a layout of a lower layer interconnection in the layout shown in FIG. 25.

FIG. 26 shows a layout of portions of the active regions up to the first interconnections in the layout shown in FIG. 25. As shown in FIG. 26, active regions 92a–92j are formed extending in the Y direction. Active regions 92a, 92e, 92f and 92j are each formed continuously extending in the Y direction. Polycrystalline silicon interconnections are formed crossing these active regions 92a–92j to form gates of the MOS transistors. FIG. 26 shows polycrystalline silicon interconnections 96a–96f constituting the gate electrodes of the access transistors.

As shown in FIG. 26, the edge cell and the dummy cell have the same layouts up to the first metal interconnections, and the patterns thereof are arranged mirror-symmetrical with respect to a boundary region in between. The normal memory cell has a pattern layout mirror-symmetric to that of the dummy cell. Therefore, the active regions and the gate electrodes have the same feature in the dummy cells, normal memory cells and edge cells. The edge cells are arranged in the boundary region and may suffer from the pattern deviation, but maintain the regularity of the pattern layouts of the normal and dummy cells. Therefore, the dummy cells and the normal memory cells can have uniform transistor characteristics with each other.

Figure 27:
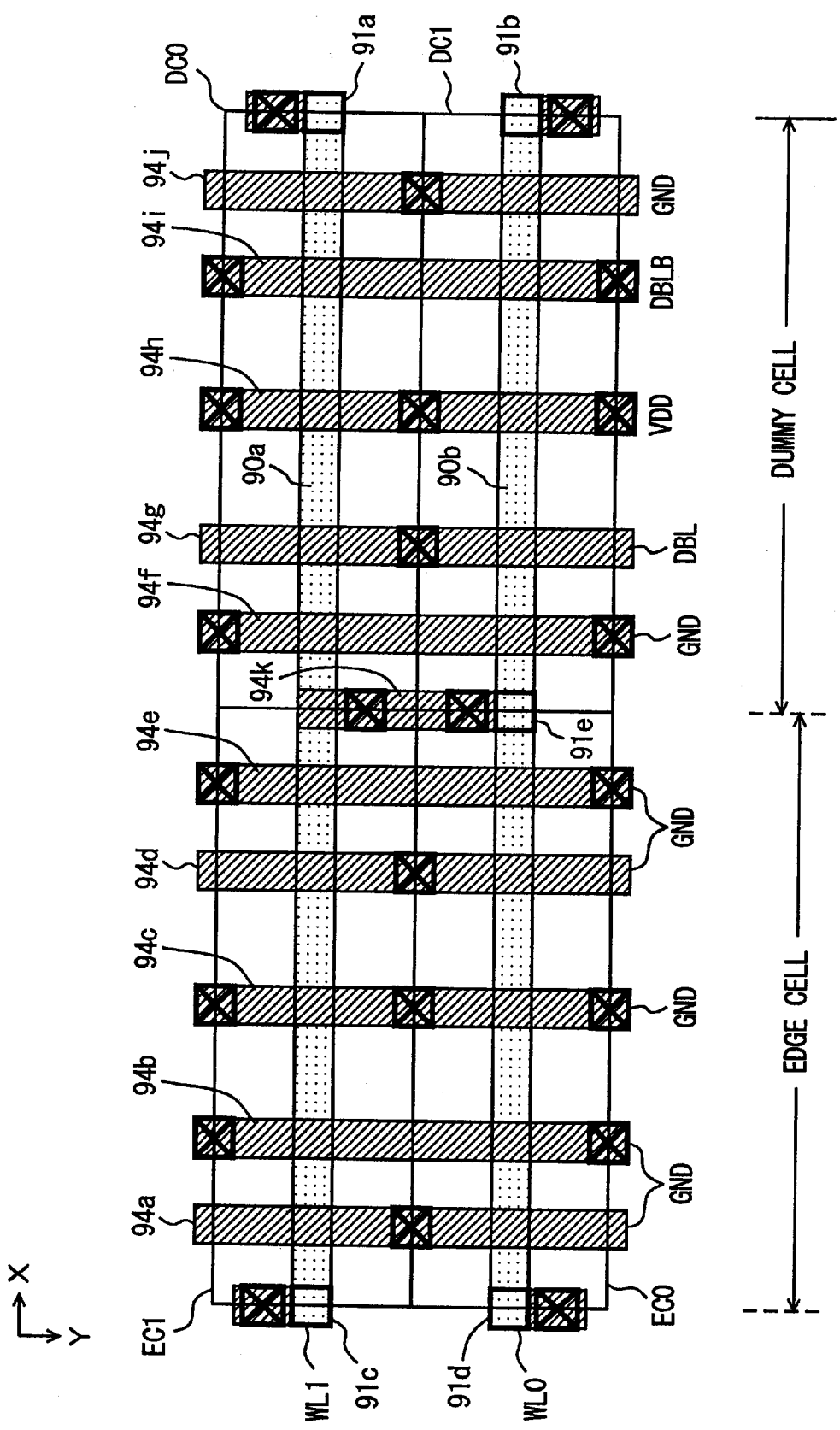
FIG. 27 shows a layout of an upper layer interconnection in the layout shown in FIG. 25.

FIG. 27 shows a layout of portions of the first via holes up to the third interconnections in a layout shown in FIG. 25. In FIG. 27, second metal interconnections 94a–94i are formed extending in the Y direction. Third metal interconnections 90a and 90b are formed along the X direction. Third metal interconnection 90a is connected through second via holes 91c and 91a arranged at the opposite ends thereof to the gates of access transistors of edge cell EC1 and dummy cell DC0, respectively.

Third metal interconnection 90b is connected through second via holes 91d and 91b arranged at the opposite ends thereof to the gates of access transistors of edge cell EC0 and dummy cell DC1. Third metal interconnection 90b is further connected to second metal interconnection 94k through second via hole 9 le formed at a boundary region between these edge cell and dummy cell.

Second metal interconnection 94k is connected to polycrystalline silicon interconnections 96c and 96d shown in FIG. 26 through first via holes. The edge cell is not utilized for data storage, and is provided merely for maintaining the regularity of the pattern. Therefore, even if second metal interconnection 94k connects the dummy cells of two or four bits commonly to one word line, no adverse effect is exerted on the data storing operation. The edge cell is used as an alternative of a "redundant cell" so that increase in area of the memory cell array can be suppressed.

In the boundary region between the dummy cell and the normal memory cell, second via holes 91a and 91b connect word lines WL1 and WL0 to the gates of access transistors of dummy cells DC0 and DC1, respectively. Therefore, the normal memory cell is mirror-symmetric in layout to the dummy cell. In contrast to the dummy cell, therefore, in each column of the normal memory cells, the normal memory cell can be accurately selected for each word line.

In edge cells EC0 and EC1, second metal interconnections 94a–94e are all fixed to ground voltage GND. Therefore, the internal nodes including the power supply node in the edge cells are all at the ground voltage level. Thus, it is possible to prevent a leakage current such as a channel leakage current, which may occur due to deviation of patterns, from flowing in edge cells EC0 and EC1, and a current consumption can be reduced.

If only two dummy bit lines are used, a set of the memory cell column and an edge cell column is arranged on each side of one memory cell array.

Ninth Embodiment

Figure 28:
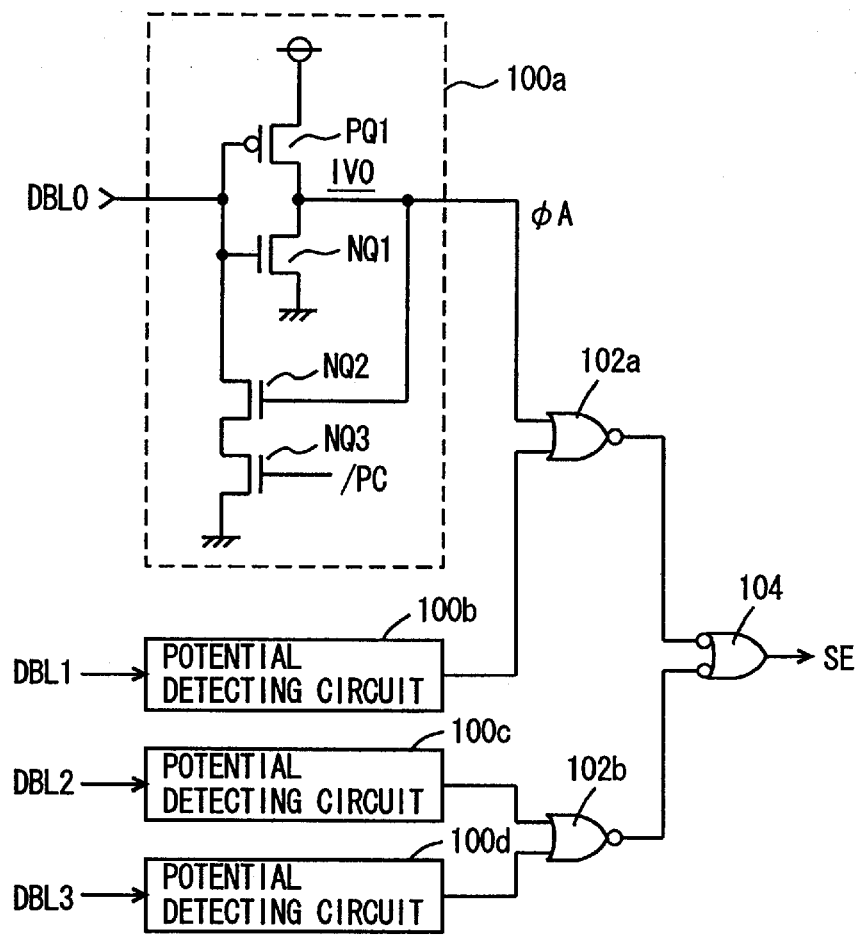
FIG. 28 shows a structure of a voltage detecting circuit according to a ninth embodiment of the invention.

FIG. 28 shows a structure of a voltage detecting circuit according to a ninth embodiment of the invention. In FIG. 28, the voltage detecting circuit includes potential detecting circuits 100a–100d provided for dummy bit lines DBL0–DBL3, respectively. These potential detecting circuits 100a–100d have the same structure, and therefore, FIG. 28 representatively shows the structure of potential detecting circuit 100a. According to the configuration of the voltage detecting circuit in FIG. 28, the dummy cells of four bits are simultaneously driven to the selected state when a corresponding word line is selected in the dummy cell column.

Potential detecting circuit 100a includes a CMOS inverter IV, which inverts a signal on dummy bit line DBL0 to produce an output signal ∅A, and N-channel MOS transistors NQ2 and NQ3 connected in series between dummy bit line DBL0 and the ground node. MOS transistor NQ2 is supplied on its gate with output signal ∅A of CMOS inverter IV. MOS transistor NQ3 is supplied on its gate with a precharge instructing signal/PC.

Precharge instructing signal/PC is the same as the signal/PRG for activating the precharge circuit 26, which precharges the dummy and normal bit lines as already described with reference to FIG. 9 and others. When the precharge circuit is active, therefore, precharge instructing signal/PC is at L level, and MOS transistor NQ3 is in an off state. When the precharge circuit is inactive, precharge instructing signal/PC is at H level, and MOS transistor NQ3 is in an on state.

CMOS inverter IV includes a P-channel MOS transistor PQ1 for driving output signal ØA to H-level in accordance with the potential on dummy bit line DBL0, and an N-channel MOS transistor NQ1 rendered conductive to set output signal ØA to L level when the voltage on dummy bit line DBL0 is at H level.

In CMOS inverter IV, MOS transistor PQ1 is configured to be small in channel width, and MOS transistor NQ1 is configured to be large in channel width. By making the channel width of N-channel MOS transistor NQ1 large, an influence by variations in characteristics of N-channel MOS transistors (drive transistors and access transistors) in the dummy cell and normal memory cell appears magnifyingly in potential detecting circuits 100a–100b. MOS transistors NQ2 and NQ3 have sufficiently large channel widths, and rapidly discharge dummy bit line DBL0 when output signal ØA attains H-level.

The voltage detecting circuit further includes a two-input NOR circuit 102a receiving the output signals of potential detecting circuits 100a and 100b, a two-input NOR circuit 102b receiving the output signals of potential detecting circuits 100c and 100d, and a NAND circuit 104 receiving the output signals of NOR circuits 102a and 102b to produce read signal SE.

Dummy bit lines DBL0–DBL3 may be arranged in any of the positions already described in the sixth to eighth embodiments.

Figure 29:
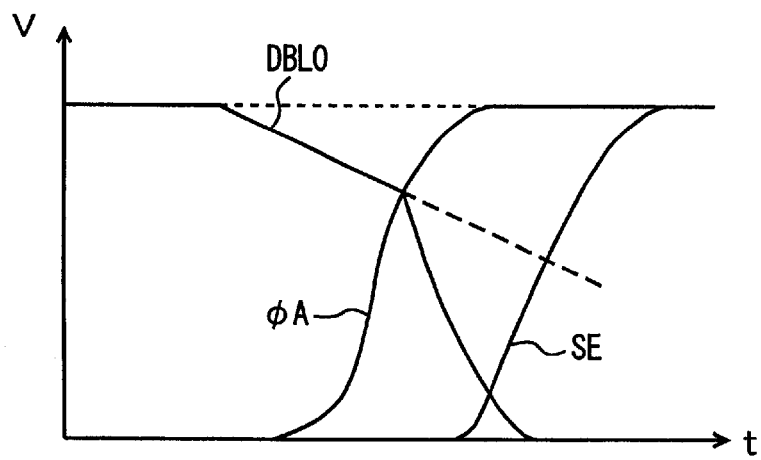
FIG. 29 is a signal waveform diagram representing an operation of the voltage detecting circuit shown in FIG. 29.

FIG. 29 is a signal waveform diagram representing an operation of the voltage detecting circuit shown in FIG. 28. Referring to FIG. 29, the operation of the voltage detecting circuit shown in FIG. 28 will now be described.

FIG. 29 illustrates, by way of example, waveforms in an operation of discharging dummy bit line DBL0. During standby, precharge instructing signal/PC is at L level, and MOS transistor NQ3 is in the off state. Dummy bit lines DBL0–DBL3 are already precharged to the power supply voltage level by precharge transistors in the corresponding precharge circuits.

When the memory cell selecting operation is performed to drive, e.g., word line WL0 to the selected state, the voltage level of dummy bit line DBL0 lowers from the precharged voltage. In this operation, precharge instructing signal/PC is at H level.

As the voltage level of dummy bit line DBL0 lowers, a conductance of P-channel MOS transistor PQ1 increases, and output signal ØA of CMOS inverter IV gradually increases in potential. When output signal ØA exceeds the input logical threshold of CMOS inverter IV, output signal ØA rapidly rises to H level. When output signal ØA attains H level, MOS transistor NQ2 is turned on. Precharge instructing signal/PC is already driven to H level when the word line is selected, and MOS transistor NQ3 is already in the on state. Therefore, when output signal ØA attains H level and MOS transistor NQ2 operates in a saturated region, dummy bit line DBL0 is rapidly discharged by MOS transistors NQ2 and NQ3 to lower its voltage level. When output signal ØA attains at H level, the output signal of NOR circuit 102a attains L level, and read signal SE provided by NAND circuit 104 attains H level.

MOS transistors NQ2 and NQ3 are provided for discharging dummy bit line DBL0 to the ground voltage level when the voltage level of output signal ØA rises. This arrangement can achieve the following advantages. It is possible to reduce a time period, during which CMOS inverter IV is in a transition region, and it is possible to reduce the time period, for which both MOS transistors PQ1 and NQ1 are on, so that the through current can be reduced, and current consumption can be reduced.

The input logical threshold of CMOS inverter IV has only to be determined to an appropriate voltage level in accordance with the activation timing of read signal SE. Even if the driving capability of MOS transistor PQ1 is made small, the input logical threshold of CMOS inverter IV can be set to an intended voltage level by adjusting the threshold voltages of MOS transistors PQ1 and NQ1.

If one dummy bit line is driven by the dummy cells of two bits, only two dummy bit lines are used. In this case, therefore, an AND circuit, which is a composite gate equivalent to a series connection of a NAND gate and an inverter, is provided for receiving output signals of potential detecting circuits 100a and 100b provided for dummy bit lines DBL0 and DBL1.

According to the ninth embodiment, as described above, the dummy bit line is driven to the ground voltage level in accordance with the output signal of the CMOS inverter detecting the potential on the dummy bit line. Thus, the potential on the dummy bit line can be used to restrict the period, for which a through current flows in the CMOS inverter of this voltage detecting circuit, so that the current consumption can be reduced.

Tenth Embodiment

Figure 30:
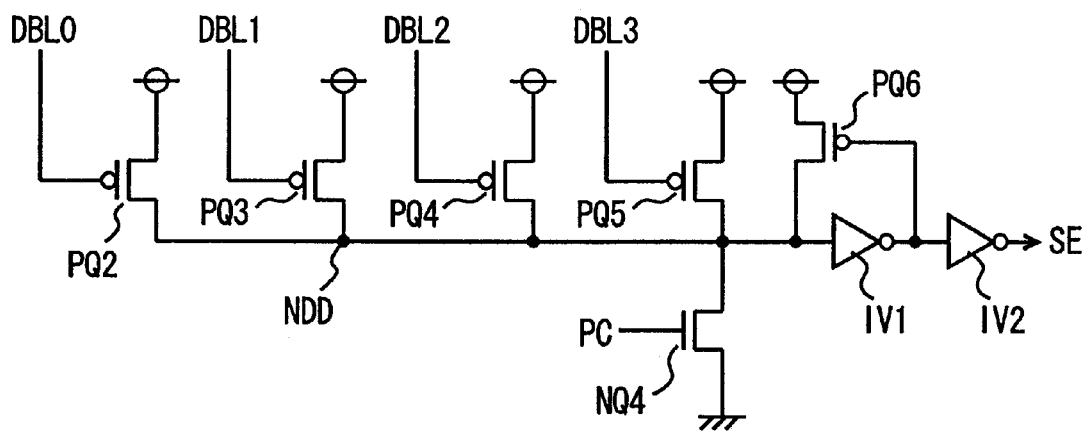
FIG. 30 shows a structure of a voltage detecting circuit according to a tenth embodiment of the invention.

FIG. 30 shows a structure of a voltage detecting circuit according to a tenth embodiment of the invention. In FIG. 30, the voltage detecting circuit includes P-channel MOS transistors PQ2–PQ5 provided corresponding to dummy bit lines DBL0–DBL3, respectively, and receiving on their respective gates the voltages on corresponding dummy bit lines DBL0–DBL3. MOS transistors PQ2–PQ5 have their drains commonly connected to node NDD, and their sources supplied with the power supply voltage.

The voltage detecting circuit further includes an N-channel MOS transistor NQ4 rendered conductive to precharge the node NDD to the ground voltage level in response to a precharge instructing signal PC, an inverter IV1 for inverting the potential on node NDD, a P-channel MOS transistor PQ6 rendered conductive to latch the node NDD at the power supply voltage level when the output signal of inverter IV1 is at L level, and an inverter IV2 for inverting the output signal of inverter IV1 to produce the read signal SE. MOS transistor PQ6 has a sufficiently large current driving capability.

Precharge instructing signal PC is set to H level when the precharge circuit for precharging dummy bit lines DBL0–DBL3 and normal bit lines BL and BLB to the power supply voltage level is active. Therefore, the internal node NDD is precharged to the ground voltage level in a standby state.

Figure 31:
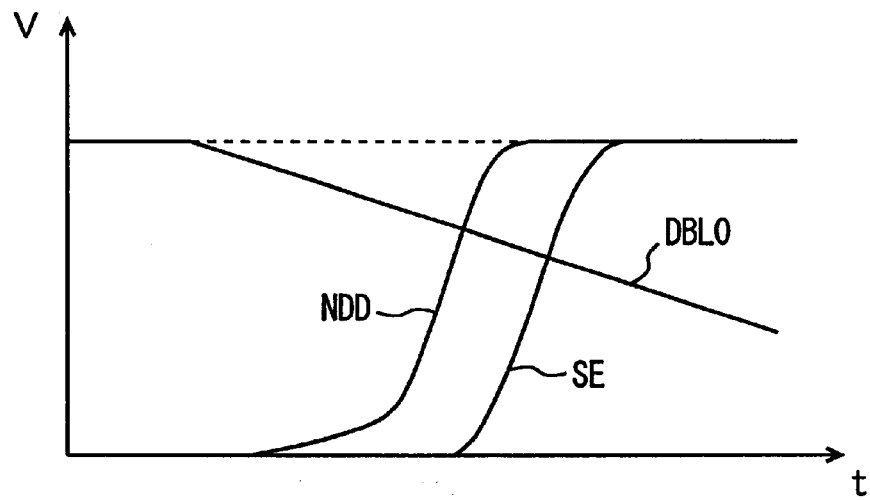
FIG. 31 is a signal waveform diagram representing an operation of a voltage detecting circuit shown in FIG. 30.

FIG. 31 is a signal waveform diagram representing the operation of the voltage detecting circuit shown in FIG. 30. Referring to FIG. 31, an operation in discharging dummy bit line DBL0 will now be described as an example of the operation of the voltage detecting circuit shown in FIG. 30.

In a standby state, all dummy bit lines DBL0–DBL3 are precharged to the power supply voltage level, and MOS transistors PQ2–PQ5 are off or non-conductive. Since precharge instructing signal PC is at H level, MOS transistor NQ4 is on or conductive, and node NDD is maintained at the ground voltage level.

When memory select instruction is supplied and a word line is selected and word line WL0, for example, is driven to the selected state, the voltage level of dummy bit line DBL0 is lowered by the dummy cells. When the voltage level of dummy bit line DBL0 lowers and a source to gate voltage of MOS transistor PQ2 exceeds an absolute value of the threshold voltage of MOS transistor PQ2, MOS transistor PQ2 is turned on to supply a current to node NDD.

At the time of start of the memory cell selecting operation, precharge instructing signal PC is at L level, and MOS transistor NQ4 is off. When the voltage level of node NDD rises and exceeds the input logical threshold of inverter IV1 owing to the charging operation of MOS transistor PQ2, the output signal of inverter IV1 attains L level, and MOS transistor PQ6 is turned on to pull up the voltage level of node NDD to the power supply voltage level at high speed. Inverter IV2 inverts the output signal of inverter IV1 to drive read signal SE to H level.

Inverter IV1 has a function of inverting and amplifying the voltage level of node NDD, and controls on/off of MOS transistor PQ6 in accordance with the voltage level of node NDD. Therefore, it is possible to reduce a time period, for which a through current flows in inverter IV1, and the current consumption can be reduced.

The dummy bit line DBL0 is connected to the gate of MOS transistor PQ2. Therefore, dummy bit line DBL0 is driven merely by the dummy cells, and is not discharged down to the ground voltage level. Therefore, it is possible to reduce the power consumption required for charging and discharging dummy bit line DBL0. This holds also in the case where the voltage levels of other dummy bit lines DBL1–DBL3 lower.

By utilizing the voltage detecting circuit shown in FIG. 30, it is possible to suppress current consumption of the circuitry for setting the read timing, and it is possible to determine accurately and internally the sense amplifier activation timing, word line deactivation timing and precharging operation activation timing.

If in the structure shown in FIG. 30, two dummy bit lines are employed, in place of four dummy bit lines, the P-channel MOS transistor is likewise arranged for each dummy bit line.

In the voltage detecting circuit shown in FIG. 30, MOS transistors PQ2–PQ5 may be replaced with N-channel MOS transistors, and node NDD may be precharged to the power supply voltage level. In this case, MOS transistor PQ6 is replaced with an N-channel MOS transistor, and inverter IV2 is not required.

Other Examples of Application

In the embodiments described above, SRAM is used as the semiconductor memory device. However, for a non-volatile semiconductor memory device such as a flash memory, in which a current flowing a bit line is detected to read data, activation timing of sense amplifier can be internally set accurately using the dummy bit lines as described above. In the case of such a non-volatile semiconductor memory device, the dummy cell is formed of a non-volatile memory cell having the same structure as a normal non-volatile memory cell for storing data. A word line is formed of a metal interconnection, a control gate of the nonvolatile memory cell is formed of polycrystalline silicon, and a connection between the metal interconnection of the word line and the polycrystalline silicon control gate in the dummy cell is made different from that in the normal memory cell.

According to the invention, as described above, the dummy cells are aligned in the row direction with the normal memory cells, and the dummy bit line is driven by a plurality of dummy cells. Thus, the voltage on the dummy bit line can be changed at high speed to produce the signal indicating the activation timing of the sense amplifier independently of the array configuration.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of normal memory cells arranged in rows and columns;
   a plurality of dummy cells arranged in columns;
   a plurality of dummy bit lines, arranged corresponding to the dummy cell columns, each connected to the dummy cells on a corresponding dummy cell column; and
   a plurality of word lines, arranged corresponding to the normal memory cell rows, each connected to the normal memory cells on a corresponding row, at least two dummy cells in each of the dummy cell columns being connected to each of the word lines.

2. The semiconductor memory device according to claim 1, wherein
   the plurality of dummy cells are arranged in alignment to the normal memory cells in a row direction.

3. The semiconductor memory device according to claim 1, further comprising:
   a plurality of normal bit lines arranged corresponding to the columns of the normal memory cells and connected to the normal memory cells in corresponding columns, each dummy bit lines being the same in load capacitance as each normal bit line.

4. The semiconductor memory device according to claim 1, wherein
   each of the plurality of dummy cells is the same in layout as each normal memory cell.

5. The semiconductor memory device according to claim 1, further comprising:
   a plurality of normal bit lines arranged corresponding to the columns of the normal memory cells and connected to the normal memory cells in corresponding columns, wherein
   a voltage on each of the dummy bit lines changes faster than a voltage on the normal bit lines when an associated word line is selected.

6. The semiconductor memory device according to claim 1, wherein
   the plurality of dummy cells are arranged in a plurality of columns and adjacent to each other at one end of a memory cell array including the normal memory cells.

7. The semiconductor memory device according to claim 1, wherein
   the dummy cell columns are placed distributedly in a memory cell array including the normal memory cells.

8. The semiconductor memory device according to claim 7, wherein
   the plurality of dummy cells are arranged at opposite ends of the memory cell array, respectively.

9. The semiconductor memory device according to claim 1, further comprising:
   potential detecting circuits arranged corresponding to the respective dummy bit lines, for detecting potentials on corresponding dummy bit lines;

a sense activating circuit for producing a sense amplifier activating signal in response to an output signal of said potential detecting circuits; and a sense amplifier activated in response to the sense amplifier activating signal, to amplify data of a selected normal memory cell.

10. The semiconductor memory device according to claim 9, wherein said sense amplifier is coupled through a column select gate to a normal bit line connected to the selected normal memory cell, and amplifies differentially a potential on the normal bit line connected to the selected normal memory cell when activated.

11. The semiconductor memory device according to claim 9, wherein the dummy cell columns are arranged at an end of a memory cell array including the normal memory cells; and said semiconductor memory device further comprises a plurality of columns of edge cells arranged in rows and columns in said memory cell array, adjacent to the dummy cell columns, respectively, the edge cells each having a same configuration as the normal memory cell.

12. The semiconductor memory device according to claim 11, wherein an internal node of each edge cell is fixed to a ground voltage level.

13. The semiconductor memory device according to claim 11, further comprising:

edge bit lines, arranged corresponding to the columns of said edge cells, each connected to the edge cells in a corresponding column and fixed to a ground voltage level.

14. The semiconductor memory device according to claim 11, wherein a column of the dummy cell columns is arranged between a column of said edge cells and a column of the normal memory cells.

15. The semiconductor memory device according to claim 1, wherein the normal memory cells are arranged in memory arrays placed on opposite sides of a row decode circuit producing a row select signal, and the plurality of dummy cells are arranged at a side of each of said memory cell arrays near said row decode circuit.

16. The semiconductor memory device according to claim 1, wherein each of the plurality of dummy cells includes an access transistor rendered conductive in response to a signal on a corresponding word line, and gates of the access transistors of a predetermined number of dummy cells arranged in a column direction of the plurality of dummy cells are interconnected.

17. The semiconductor memory device according to claim 9, wherein said potential detecting circuits each include:

a gate circuit coupled to a corresponding dummy bit line through a high input impedance and activated to amplify and output a potential on the corresponding dummy bit line in response to an operation mode instructing signal.

18. The semiconductor memory device according to claim 17, wherein said gate circuit includes:

a CMOS inverter for receiving a potential on the corresponding dummy bit line, and a latch gate responsive to activation of said operation mode instructing signal, for driving the potential on the corresponding dummy bit line to a predetermined voltage level in accordance with an output signal of said CMOS inverter.

19. The semiconductor memory device according to claim 17, wherein said gate circuits each include an insulated gate field effect transistor having a gate coupled to the corresponding dummy bit line for driving an internal node to a first potential level in response to the potential on the corresponding dummy bit line, said internal node being arranged commonly to said gate circuits; and said sense amplifier activating circuit includes;

a precharge transistor for precharging said internal node to a first voltage level, a latch amplifier for activating and latching the sense amplifier activating signal in response to the potential on said internal node.

20. The semiconductor memory device according to claim 17, wherein said sense amplifier activating circuit activates said sense amplifier activating signal when at least one of said potential detecting circuits provides an output signal at a first logical level.

* * * * *